United States Patent
Oohata

(10) Patent No.: US 7,220,608 B2
(45) Date of Patent: *May 22, 2007

(54) TRANSFERRING SEMICONDUCTOR CRYSTAL FROM A SUBSTRATE TO A RESIN

(75) Inventor: Toyoharu Oohata, Kanagawa (JP)

(73) Assignee: Sony Corporation, Tokyo (JP)

( * ) Notice: Subject to any disclaimer, the term of this patent is extended or adjusted under 35 U.S.C. 154(b) by 79 days.

This patent is subject to a terminal disclaimer.

(21) Appl. No.: 11/100,203

(22) Filed: Apr. 6, 2005

(65) Prior Publication Data

US 2005/0186763 A1    Aug. 25, 2005

Related U.S. Application Data

(60) Continuation of application No. 10/894,771, filed on Jul. 20, 2004, now Pat. No. 6,881,599, which is a division of application No. 10/308,914, filed on Dec. 3, 2002, now Pat. No. 6,770,960.

(30) Foreign Application Priority Data

Dec. 3, 2001    (JP)    ............................. 2001-368570

(51) Int. Cl.
*H01L 21/00* (2006.01)

(52) U.S. Cl. .................. 438/28; 438/33; 438/106; 257/E33.066

(58) Field of Classification Search ........... 438/22–47, 438/455–465, 106–127
See application file for complete search history.

(56) References Cited

U.S. PATENT DOCUMENTS

| 5,593,917 | A  | 1/1997  | Nuyen |
| 5,726,465 | A  | 3/1998  | Gerner et al. |
| 6,613,610 | B2 | 9/2003  | Iwafuchi et al. |
| 6,614,103 | B1 | 9/2003  | Durocher et al. |
| 6,656,819 | B1 | 12/2003 | Sugino et al. |
| 6,683,416 | B1 | 1/2004  | Oohata et al. |
| 6,818,463 | B2 | 11/2004 | Biwa et al. |
| 2002/0048905 | A1 | 4/2002 | Ikegami et al. |
| 2002/0115265 | A1 | 8/2002 | Iwafuchi et al. |
| 2002/0117677 | A1 | 8/2002 | Okuyama et al. |
| 2003/0011377 | A1 | 1/2003 | Oohata et al. |
| 2003/0087476 | A1 | 5/2003 | Oohata et al. |
| 2003/0157741 | A1 | 8/2003 | Oohata et al. |
| 2003/0162463 | A1 | 8/2003 | Hayashi et al. |

*Primary Examiner*—Savitri Mulpuri
(74) *Attorney, Agent, or Firm*—Wolf, Greenfield & Sacks, P.C.

(57) ABSTRACT

A semiconductor crystal layer formed by epitaxial growth on a seed crystal substrate is embedded in an insulating material in the condition where the seed crystal substrate is removed, electrodes are provided respectively on a first surface of the semiconductor crystal layer and a second surface of the semiconductor layer opposite to the first surface, and lead-out electrodes connected to the electrodes are led out to the same surface side of the insulating material. The semiconductor crystal layer functions as a semiconductor light-emitting device or a semiconductor electronic device. The insulating material is, for example, a resin.

1 Claim, 25 Drawing Sheets

LIGHT OUTPUT

LIGHT OUTPUT

LIGHT OUTPUT

LIGHT OUTPUT

F I G. 1 2
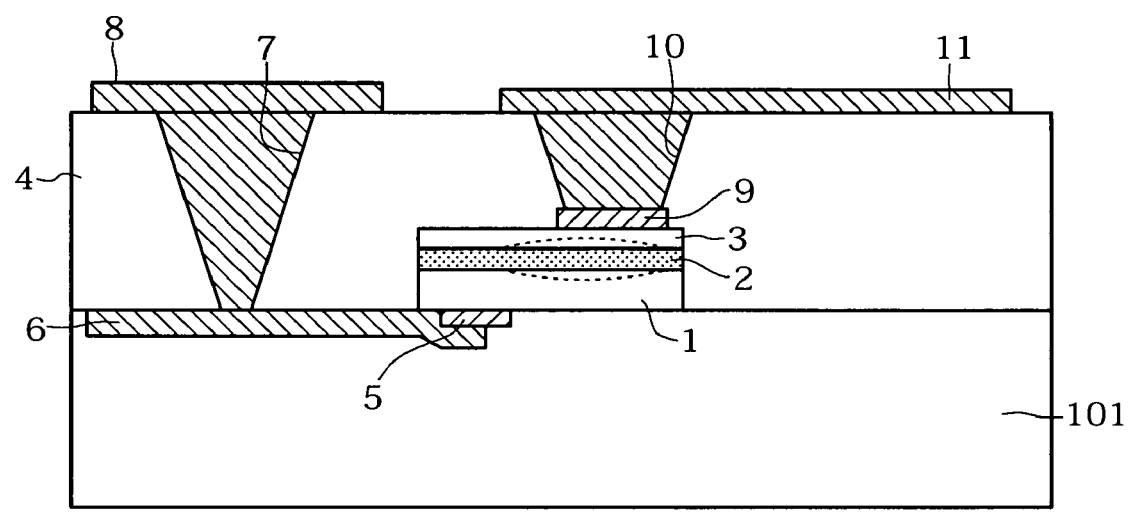

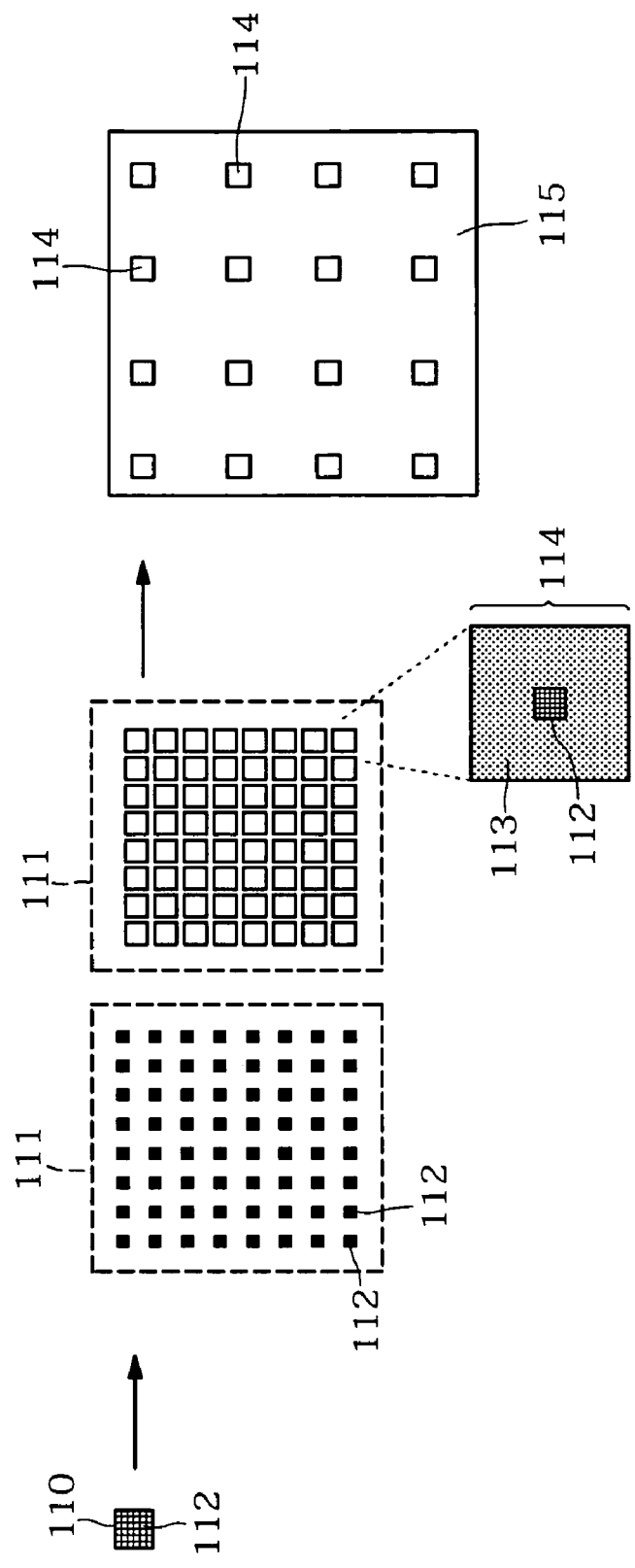

LASER

O₂ PLASMA

LASER

O₂ PLASMA

LASER

TRANSFERRING SEMICONDUCTOR CRYSTAL FROM A SUBSTRATE TO A RESIN

CROSS REFERENCE TO RELATED APPLICATIONS

This application is a Continuation of application Ser. No. 10/894,771, filed on Jul. 20, 2004 now U.S. Pat. No. 6,881,599, entitled TRANSFERRING SEMICONDUCTOR CRYSTAL FROM A SUBSTRATE TO A RESIN which, in turn, is a Divisional of prior application Ser. No. 10/308,914, filed on Dec. 3, 2002, entitled TRANSFERRING SEMICONDUCTOR CRYSTAL FROM A SUBSTRATE TO A RESIN (now U.S. Pat. No. 6,770,960) which, in turn, claims priority to Japanese application No. JP2001-368570 filed Dec. 3, 2001.

BACKGROUND OF THE INVENTION

The present invention relates to an electronic part including as an active device a semiconductor crystal layer formed by epitaxial growth on a seed crystal substrate, and a method of producing the same. Furthermore, the present invention relates to an image display system including such electronic parts, and a method of manufacturing the same.

In the case of arranging light-emitting devices in a matrix form to assemble an image display system, it has hitherto been practiced to forming the devices directly on a substrate such as in the cases of a liquid crystal display system (LCD) and a plasma display panel (PDP) or to arrange singular LED packages in the case of a light-emitting diode display (LED). For example, in the cases of the image display systems such as LCD and PDP, the devices cannot be separated individually, so that it has been a usual practice to form the devices spaced from each other by the pixel pitch of the image display system, from the beginning of the manufacture process.

On the other hand, in the case of the LED display, it has been practiced to take out the LED chips after dicing, and connect the LED chips individually to external electrodes by bump connection using wire bonding or flip chips, thereby packaging the LED chips. In this case, the LED chips are arranged at the pixel pitch of the image display system before or after the packaging, and the pixel pitch is made to be independent from the pitch at which the devices are produced.

Since the LED (Light-Emitting Diode) as the light-emitting device is expensive, it is possible to lower the cost of the image display system using the LEDs by producing a multiplicity of LED chips from a single sheet of wafer. Namely, where the size of the LED chips is several tens of μm square, as contrasted to about 300 μm square in the related art, and the LED chips are connected to manufacture an image display system, it is possible to reduce the price of the image display system.

Meanwhile, among the individual semiconductor devices such as not only the light-emitting diode but also, for example, laser diode and transistor device, there are some devices in which the overall area of the device must be not less than several times of the active region (for example, not less than 0.2 mm square) although the size of the active region necessary for operation is on the order of μm. This hampers an enhancement of the actual mounting density of the device or a lowering in the cost of the device.

For example, in the case of high-luminance LED, in account of the fact that a luminance of about several cd is obtained at a chip size of about 300 μm square and according to proportional shrinkage, low-luminance LED with a luminance of not more than about several mcd might have an active region (active layer area) of about 10 μm square. However, according to the conventional device structure and conventional mounting method, it is difficult to set the overall size of the device closer to the size of the active region. In the case of laser diode, the active region is in a stripe form with a width of several μm and a length of several hundreds of μm, but in actual mounting, the device size has a width of not less than about 200 μm.

Particularly, in the case of a light-emitting diode or a laser diode that is produced by epitaxial growth of a gallium nitride based crystal on a sapphire substrate, the cathode side (n-type semiconductor layer) and the anode side (p-type semiconductor layer) are sequentially laminated. In this case, since the substrate is an insulating body, two electrodes must be provided on the growth surface side, so that the device size is large due to wire bonding, but the actual area of the active region (active layer) is rather small. Therefore, internal resistance is high due to flow of current in a lateral direction, and several drawbacks such as unfavorable concentration of current are generated.

On the other hand, in the case of a light-emitting diode composed of an aluminum gallium indium phosphide based crystal grown on a gallium arsenide substrate, electrodes can be provided on both sides of the device, but a portion of the light emitted at an active layer is absorbed by the substrate, so that only an external light emission efficiency much lower than an intrinsic internal light emission efficiency can be obtained. In order to solve this problem, a variety of contrivances have been practiced, for example, formation of a semiconductor multilayer film (DBR) for light reflection in the inside, formation of a thick window layer, or a transfer onto a transparent substrate. These contrivances lead to a rise in cost.

SUMMARY OF THE INVENTION

The present invention has been proposed in consideration of the above situations in the related art. Accordingly, it is an object of the present invention to provide an electronic part in which the number of devices formed from a single sheet of crystalline wafer can be enlarged as compared with the conventional packaged devices, production cost can be reduced, and it is easy to mount the electronic part in high density, and a method of producing the same. In addition, it is another object of the present invention to provide a large-type system, a high-performance system, and a system based on integration of a different kinds of devices (for example, image display system), which cannot be realized with a system based on integration of a multiplicity of devices produced by a monolithic process.

In order to attain the above objects, according to an aspect of the present invention, there is provided an electronic part, semiconductor crystal layer formed by epitxial growth on a seed crystal substrate is embedded in an insulating material in the condition where the seed crystal substrate is removed, electrodes are provided on a first surface of the semiconductor crystal layer and a second surface of the semiconductor crystal layer opposite to the first surface, and lead-out electrodes connected to the electrodes are led out to the same surface side of the insulating material. A method of producing an electronic part according to the present invention includes a step of epitaxial growth of a semiconductor crystal layer on a seed crystal substrate, a step of embedding the semiconductor crystal layer in an insulating material and removing the seed crystal substrate, a step of forming an electrode connected to one surface of the semiconductor crystal layer, a step of transferring the semiconductor crystal layer embedded in the insulating material onto a support substrate, a step of forming an electrode connected to the opposite side surface of the semiconductor crystal layer, and a step of forming lead-out electrodes connected to the electrodes by leading out the lead-out electrodes to the same surface side of the insulating material.

In the electronic part having the above-mentioned structure, the region necessary for actual mounting and leading-out of electrodes is minimized, and the overall size of the device is suppressed to be small. In addition, for example, in the case of a light-emitting diode, a laser diode, or the like produced by epitaxial growth of a gallium nitride based crystal on a sapphire substrate, such problems as an increase in internal resistance and unfavorable concentration of current are dissolved. In the case of a light-emitting diode including an aluminum gallium indium phosphide based crystal grown on a gallium arsenide substrate, high light emission efficiency is realized, and such contrivances that may cause a rise in cost are unnecessary.

On the other hand, according to another aspect of the present invention, there is provided an image display system including electronic parts including light-emitting devices arranged in a matrix form on a substrate, each of the electronic parts constituting a pixel. A semiconductor crystal layer functioning as a light-emitting device produced by epitaxial growth on a seed crystal substrate is embedded in an insulating material in the condition where the seed crystal substrate is removed, electrodes are provided respectively on a first surface of the semiconductor crystal layer and a second surface of the semiconductor crystal layer opposite to the first surface, each of the electronic parts is covered with an insulating layer, and lead-out electrodes each connected to each of the electrodes of the semiconductor crystal layer contained in the electronic part are led out to the face side of the insulating layer. In addition, a method of manufacturing an image display system according to the present invention resides in a method of manufacturing an image display system including electronic parts including light-emitting devices arranged in a matrix form on a substrate, each of the electronic parts constituting a pixel. The method includes a step of epitaxially growing semiconductor crystal layers for functioning as light-emitting devices on a seed crystal substrate, a first transfer step of transferring the semiconductor crystal layers onto a first temporary holding member in the condition where the semiconductor crystal layers are spaced wider apart than they have been arranged on the seed crystal substrate and holding the semiconductor crystal layers by embedding the semiconductor crystal layers in an insulating material, a step of forming electrodes connected to one side of the semiconductor crystal layers, a second transfer step of transferring the semiconductor crystal layers embedded in the insulating material onto a second temporary holding member, a step of forming electrodes connected to the opposite side of the semiconductor crystal layers, a step of cutting the insulating material with the semiconductor crystal layers embedded therein to separate individual electronic parts, a third transfer step of transferring the electronic parts held on the second temporary holding member onto a second substrate while spacing the electronic parts further wider apart, a step of providing an insulating layer so as to cover each of the electronic parts, and a step of leading out, to the face side of the insulating layer, lead-out electrodes connected to the electrodes of the semiconductor crystal layers contained in the electronic parts.

According to the image display system and the method of manufacturing the same, the light-emitting devices rearranged in the spaced-apart condition are arranged in a matrix form to constitute an image display portion. Therefore, the light-emitting devices produced by fine processing with a dense condition, namely, with a high degree of integration can be efficiently rearranged in the spaced-apart condition, and productivity is largely enhanced. In addition, the light-emitting devices converted into electronic parts can be actually mounted in a high density, and wiring therefor can be easily formed.

According to the present invention, it is possible to provide an electronic part such that the number of devices produced from a single sheet of crystal wafer can be enlarged as compared with the conventional packaged devices, the production cost can be reduced, and actual mounting in a high density is easy. In addition, it is possible to provide a large-type system, a high-performance system, and a system based on integration of different kinds of devices (for example, an image display system), which cannot be realized with a system based on integration of a multiplicity of devices produced by a monolithic process. On the other hand, according to the image display system and the method of manufacturing the same according to the present invention, while the above-mentioned merits are maintained, the light-emitting devices produced by fine processing with a dense condition, namely, with a high degree of integration can be efficiently rearranged with the spaced-apart condition. Therefore, an image display system with high accuracy can be produced with high productivity.

BRIEF DESCRIPTION OF THE DRAWINGS

These and other objects of the invention will be seen by reference to the description, taken in connection with the accompanying drawing, in which:

FIG. 12 is a general sectional view showing one example in which a resin layer is provided covering an electrode on the back side;

FIGS. 13A to 13D show schematic diagrams illustrating a method of arranging devices;

FIGS. 16A and 16B show views showing one example of a light-emitting device, in which FIG. 16A is a sectional view, and FIG. 16B is a plan view;

DETAILED DESCRIPTION OF THE PREFERRED EMBODIMENTS

Figure 1:
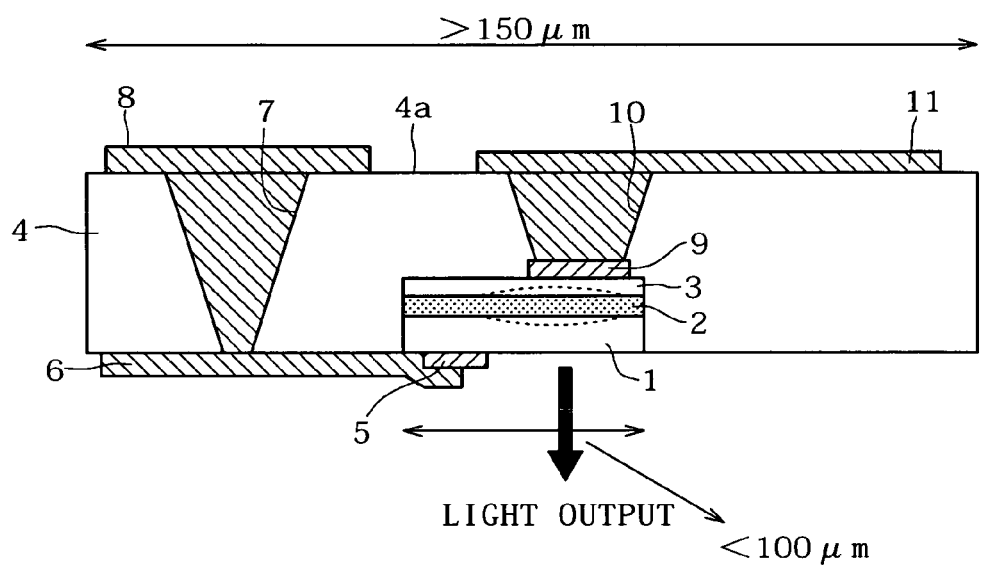
FIG. 1 is a general sectional view showing one example in which the present invention is applied to a gallium nitride based light-emitting diode.

Now, an electronic part and a method of producing an electronic part by application of the present invention, and further, an image display system and a method of manufacturing an image display system by application thereof will be described in detail below referring to the drawings.

FIG. 1 shows an example in which the present invention is applied to a gallium nitride based light-emitting diode. The light-emitting diode is composed of an n-GaN window layer 1 epitaxially grown on a sapphire substrate, a GaInN active layer 2, and a p-GaN clad layer 3. These semiconductor crystal layers are embedded in a resin layer 4. The size of the semiconductor crystal layer is, for example, not more than 100 μm square, and the size of the resin layer 4 is, for example, not less than 150 μm square. Of the GaInN active layer 2, the region surrounded by the broken line is an active region, and a light output in the direction of the arrow is obtained.

The n-GaN window layer 1 is exposed from the resin layer 4 to the outside, and a cathode contact electrode 5 is provided in contact with the surface fronting on the outside. In addition, a cathode take-out electrode 6 is provided in the state of being connected to the cathode contact electrode 5. A lead-out electrode 8 led out to an upper surface 4a in the figure of the resin layer 4 through a via 7 penetrating through the resin layer 4 is provided in the state of being connected to the cathode take-out electrode 6. On the other hand, an anode contact electrode 9 is provided in the state of being connected to the surface on the opposite side of the semiconductor crystal layer functioning as a light-emitting diode, namely, to the surface of the p-GaN clad layer 3, and again, an anode take-out electrode 11 led out to the upper surface 4a of the resin layer 4 through a via 10 is provided.

Figure 2:
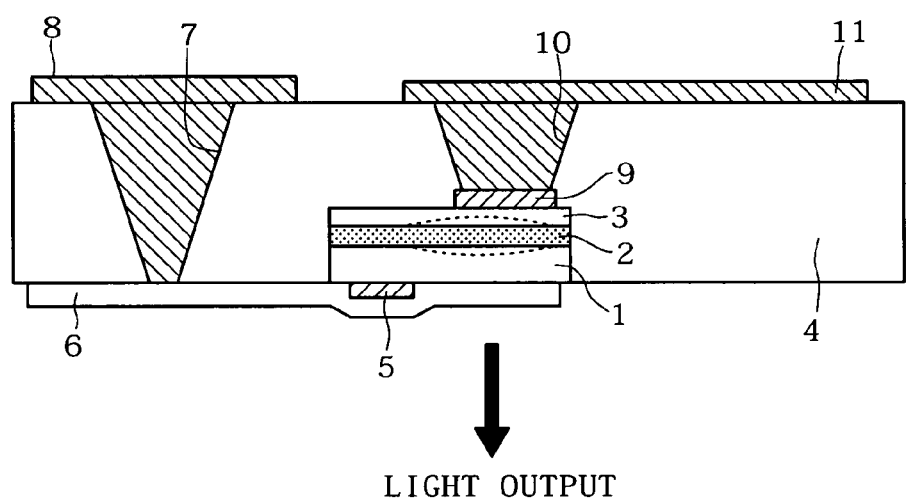
FIG. 2 is a general sectional view showing one example in which a cathode take-out electrode is a transparent electrode.

In this example, a semiconductor device having a size of not more than 100 μm square is embedded in the resin having a size of not less than 150 μm square, the number of devices produced from a single sheet of wafer is greater as compared with that in the case of conventional type devices, and it is enabled to achieve a high light emission efficiency and a mechanical mounting in a high density. Where the cathode take-out electrode 6 is formed of a transparent electrode material as a transparent electrode, take-out of light is not hindered without forming the cathode take-out electrode 6 as a larger pattern to form an electrode pattern with high accuracy as shown in FIG. 2.

Figure 3:
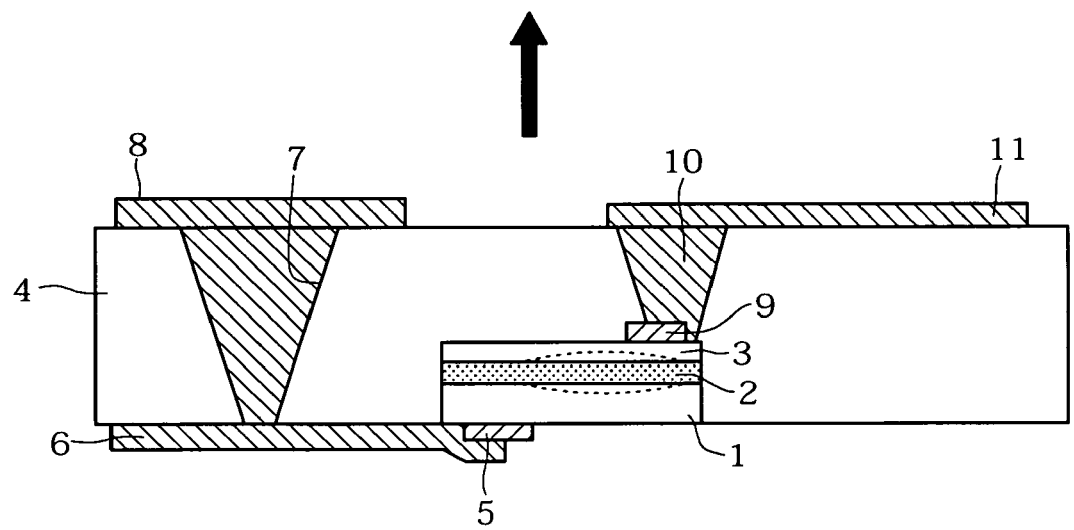
FIG. 3 is a general sectional view showing one example in which light is outputted from the side of an electrode pad.

While a structure in which light is outputted downwards in the figure, namely, from the surface on the opposite side of the surface where electrode pads for connection (a lead-out electrode 8 and an anode take-out electrode 11) are formed is adopted in the above example, a structure in which light is outputted from the surface where the electrode pads are formed may also be adopted. FIG. 3 shows an example in which the latter structure is adopted. In this example, the basic structure is the same as that in FIG. 1 above, but the light is outputted in the direction of the arrow (upwards in the figure) as shown in the figure.

Figure 4:
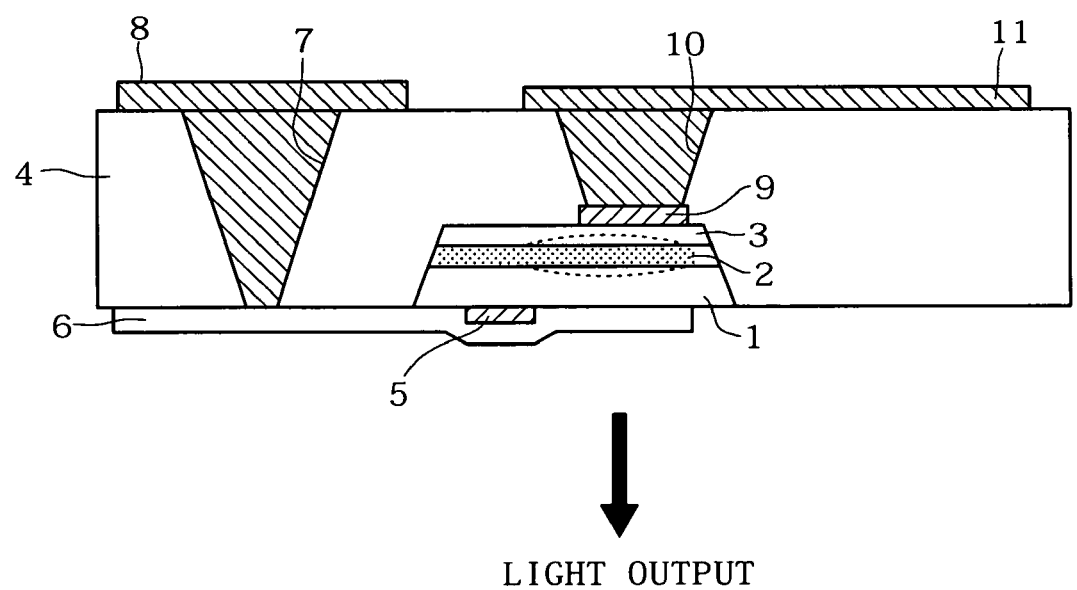
FIG. 4 is a general sectional view showing one example in which a side surface of a light-emitting diode is composed of a {1-101} crystal plane (S plane)

FIG. 4 shows an example in which side surfaces of a light-emitting diode (namely, a semiconductor crystal layer) are each constituted of a {1-101} crystal plane (S plane). Though the basic structure is the same as that in FIG. 1, the side surfaces of the semiconductor crystal layer composing of the n-GaN window layer 1, the GaInN active layer 2, and the p-GaN clad layer 3 are slant surfaces. With the side surfaces of the semiconductor crystal layer being slant surfaces (S planes), the light discharged in lateral directions in the case of the device with the vertical side surfaces is radiated forwards after being reflected back due to internal reflection, and the efficiency of take-out of light toward the front side (in the direction of the arrow) is enhanced. Therefore, as a result, the luminance as viewed from the front side is enhanced, in the case of operation with a fixed electric power.

Figure 5:
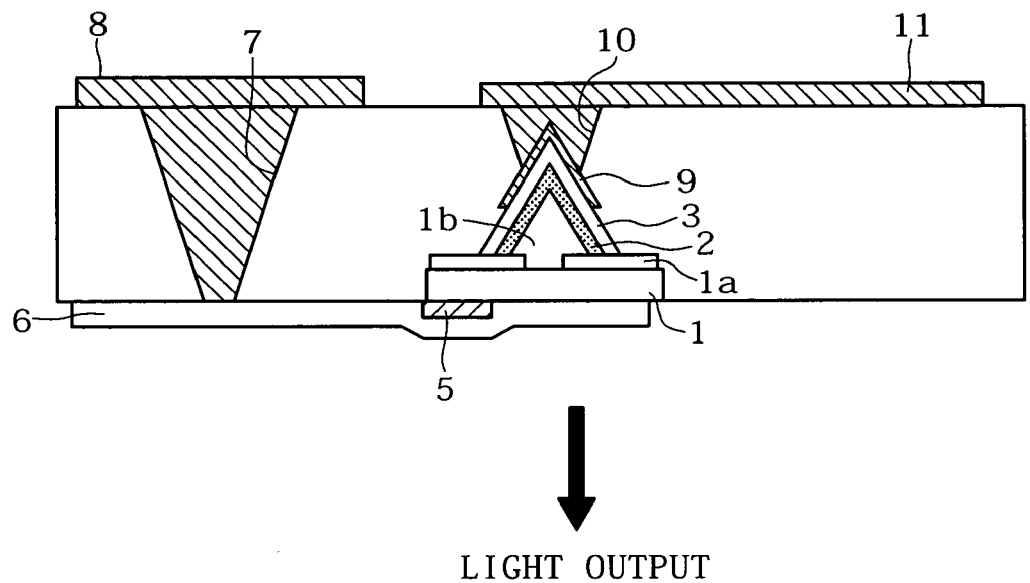
FIG. 5 is a general perspective view showing another example in which a side surface of a light-emitting diode is composed of an S plane.

FIG. 5 shows an example in which the structure shown in FIG. 4 is further developed. In this example, side surfaces of a light-emitting diode (semiconductor crystal layer) are each composed of an S plane. In concrete, a growth inhibitive mask 1a is provided on the surface of an n-GaN window layer 1, and by the crystal growth inhibitive effect of the mask 1a, an n-GaN window layer 1b, a GaInN active layer 2, and a p-GaN clad layer 3 are epitaxially grown thereon in a conical shape or a polygonal pyramid shape. Where such a structure is adopted, the light discharged in lateral directions in the case of a device with vertical side surfaces is radiated forwards after being reflected back due to internal reflection, and the luminance as viewed from the front side is enhanced. Simultaneously, the active layer formed on the S plane has fewer crystal defects as compared with a conventional C plane (0001), so that internal light emission efficiency is high, and synthetically, a further enhancement of luminance is obtained.

Figure 6:
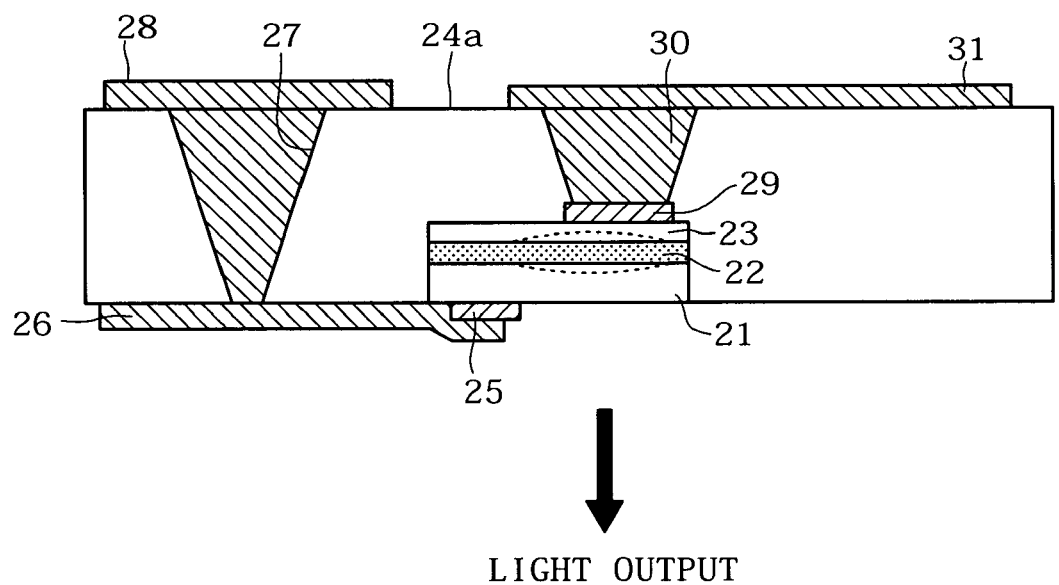
FIG. 6 is a general sectional view showing one example in which the present invention is applied to an aluminum gallium indium phosphide based light-emitting diode device.

FIG. 6 shows an example in which the present invention is applied to an aluminum gallium indium phosphide based light-emitting diode device. The basic structure is the same as that shown in FIG. 1 above, and only the constitution of the device differs. In concrete, the aluminum gallium indium phosphide based light-emitting diode device is composed of an n-AlGaInP window layer 21 formed by epitaxial growth on a seed crystal substrate constituting of gallium arsenide or indium phosphide, an AlGaNiP active layer 22, and a p-AlGaInP clad layer 23, as shown in FIG. 6. The aluminum gallium indium phosphide based light-emitting diode device is embedded in a resin layer 24; of the AlGaInP active layer 22, the region surrounded by the broken line is an active region, and a light output is obtained in the direction of the arrow.

Figure 7:
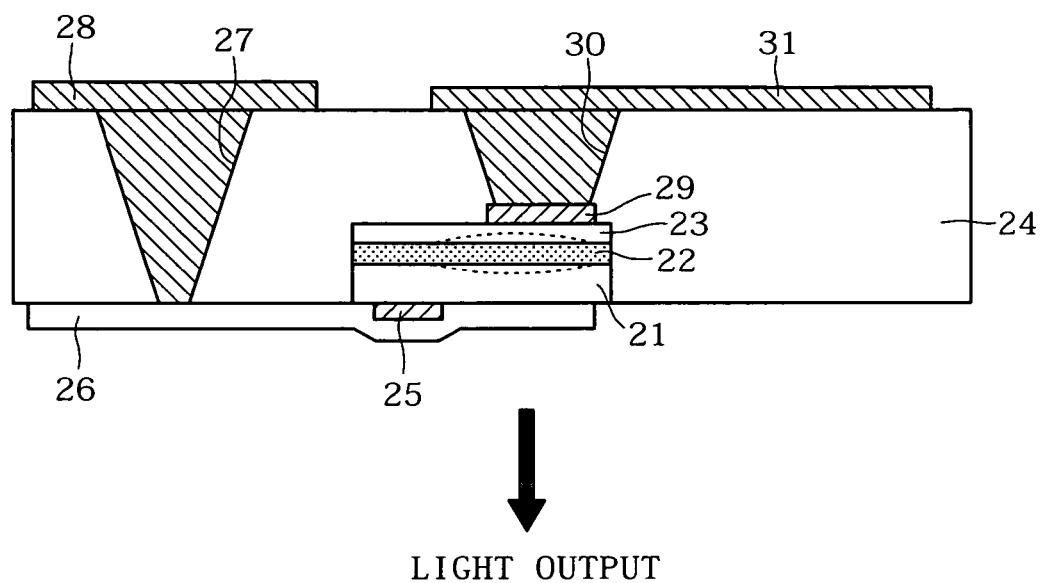
FIG. 7 is a general sectional view showing one example in which a cathode take-out electrode is a transparent electrode.

The n-AlGaInP window layer 21 is exposed from the resin layer 24 to front on the outside, and a cathode contact electrode 25 is provided in contact with the surface fronting on the outside. In addition, a cathode take-out electrode 26 is provided in the state of being connected to the cathode contact electrode 25. A lead-out electrode 28 led out to an upper surface 24a in the figure of the resin layer 24 through a via 27 penetrating through the resin layer 24 is provided in the state of being connected to the cathode take-out electrode 26. On the other hand, an anode contact electrode 29 is provided in contact with the surface on the opposite side of the semiconductor crystal layer functioning as a light-emitting diode, namely, with the surface of the p-AlGaInP clad layer 23, and again, an anode take-out electrode 31 led out to the upper surface 24a of the resin layer 24 through a via 30 is provided. In this example, the semiconductor device having a size of not more than 100 μm square is embedded in a resin having a size of not less than 150 μm square, the number of devices produced from a single sheet of wafer is greater as compared with the conventional type devices, and a high light emission efficiency and a mechanical mounting in a high density are enabled. Where the cathode take-out electrode 26 is formed of a transparent electrode material as a transparent electrode, take-out of light is not hindered without forming the cathode take-out electrode 26 as a large pattern to form an electrode pattern with high accuracy as shown in FIG. 7.

Figure 8:
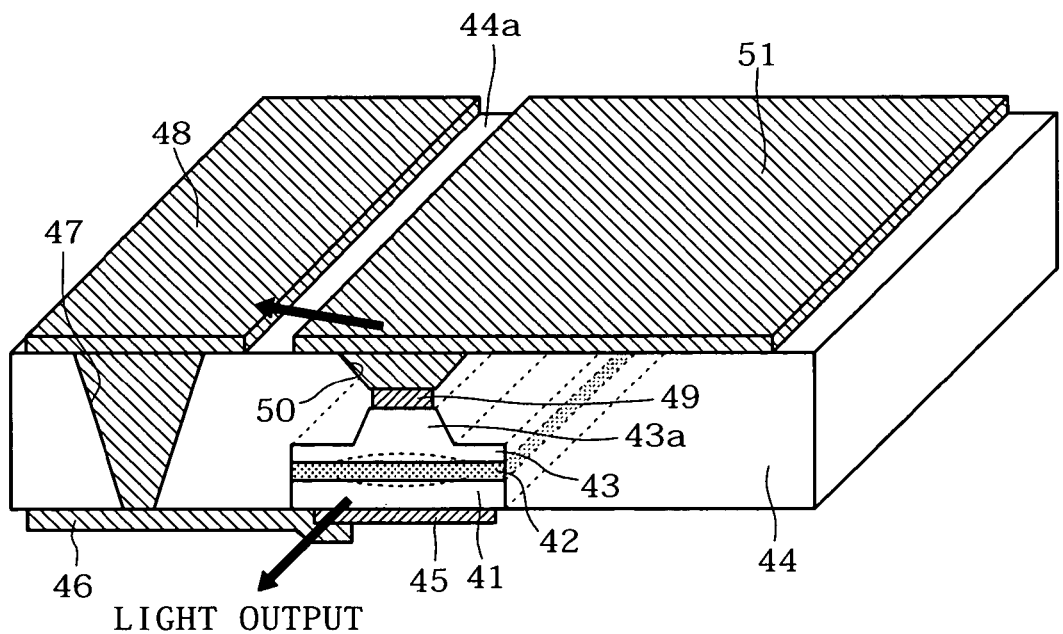
FIG. 8 is a general perspective view showing one example in which the present invention is applied to a gallium nitride based laser diode.

FIG. 8 shows an example in which the present invention is applied to a gallium nitride based laser diode. The laser diode is composed of an n-GaN window layer 41 epitaxially grown on a sapphire substrate, a GaInN active layer 42, and a p-GaN clad layer 43, and these semiconductor crystal layers are embedded in a resin layer 44. The p-GaN clad layer 43 has a rib portion 43a with a predetermined width (for example, 3 μm in width); corresponding to this, of the GaInN active layer 42, the region surrounded by the broken line functions as an active region, and a light output is obtained in the direction of the arrow.

The n-GaN window layer 41 is exposed from the resin layer 44 to front on the outside, and a cathode contact electrode 45 is provided in contact with the surface fronting on the outside. In addition, a cathode take-out electrode 46 is provided in the state of being connected to the cathode contact electrode 45. A lead-out electrode 48 led out to an upper surface 44a in the figure of the resin layer 44 through a via 47 penetrating through the resin layer 44 is provided in the state of being connected to the cathode take-out electrode 46. On the other hand, an anode contact electrode 49 is provided in contact with the surface on the opposite side of the semiconductor crystal layer functioning as a laser diode, namely, with the surface of the rib portion 43a of the p-GaN clad layer 43, and again, an anode take-out electrode 51 led out to the upper surface 44a of the resin layer 44 through a via 50 is provided.

In the above example, the width of the active region is about 3 μm, so that the width of the semiconductor crystal layer to be diced can be reduced to about 10 μm. In addition, by disposing this package directly on a heat sink, it is possible to reduce thermal resistance as compared with the case where the sapphire substrate is left, and to restrain a lowering in the performance due to heat generation. Further, by cleavage after separation from the sapphire substrate, the resulting flat end face becomes a mirror surface with high quality for constituting an optical resonator, and a laser device with high performance can be obtained in a high yield.

Figure 9:
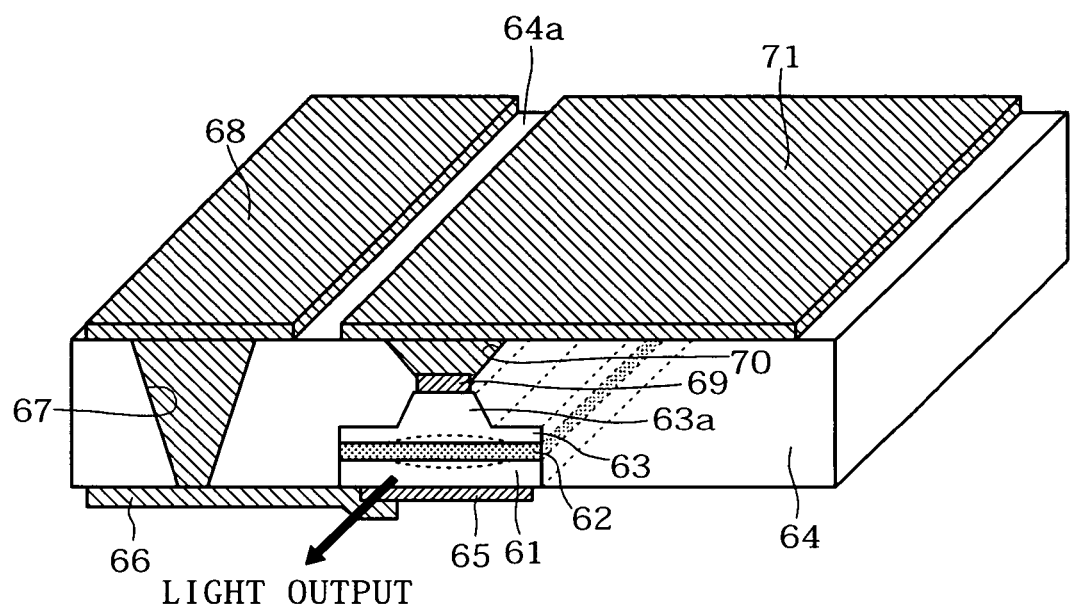
FIG. 9 is a general perspective view showing one example in which the present invention is applied to an aluminum gallium indium phosphide based laser diode device.

FIG. 9 shows an example in which the present invention is applied to an aluminum gallium indium phosphide based laser diode device. The basic structure is the same as that shown in FIG. 8 above, and only the constitution of the device differs. In concrete, the aluminum gallium indium phosphide based laser diode device is composed of an n-AlGaInP window layer 61 formed by epitaxial growth on a seed crystal substrate constituting of gallium arsenide or indium phosphide, an AlGaInP active layer 62, and a p-AlGaInP clad layer 63, as shown in FIG. 8. The aluminum gallium indium phosphide based laser diode device is embedded in a resin layer 64, and the p-AlGaInP clad layer 63 has a rib portion 63a with a predetermined width (for example, 3 μm in width); corresponding to this, of the AlGaInP active layer 62, the region surrounded by the broken line functions as an active region, and a light output is obtained in the direction of the arrow.

The n-AlGaInP window layer 61 is exposed from the resin layer 64 to front on the outside, and a cathode contact electrode 65 is provided in contact with the surface fronting on the outside. In addition, a cathode take-out electrode 66 is provided in the state of being connected to the cathode contact electrode 65. A lead-out electrode 68 led out to an upper surface 64a in the figure of the resin layer 64 through a via 67 penetrating through the resin layer 64 is provided in the state of being connected to the cathode take-out electrode 66. On the other hand, an anode contact electrode 69 is provided in contact with the surface on the opposite side of the semiconductor crystal layer functioning as a light-emitting diode, and again, an anode take-out electrode 71 led out to the upper surface 64*a* of the resin layer 64 through a via 70 is provided.

Also in the above example, the width of the active region is about 3 µm, so that the width of the semiconductor crystal layer to be diced can be reduced to about 10 µm. In addition, by disposing this package directly on a heat sink, it is possible to reduce thermal resistance as compared with the case where the sapphire substrate is left, and to restrain a lowering in the performance due to heat generation. Further, where a window structure is formed in the vicinity of an end face so as to enhance the output, cleavage after removal of the substrate makes it possible to control the position of the end face with high accuracy, and to obtain a device with stable performance in a high yield.

Figure 10:
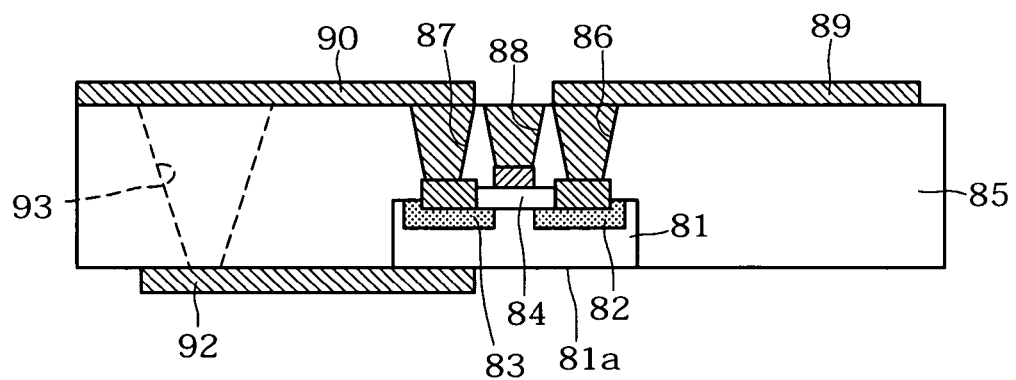
FIG. 10 is a general sectional view showing one example in which the present invention is applied to a field effect type transistor.
Figure 11:
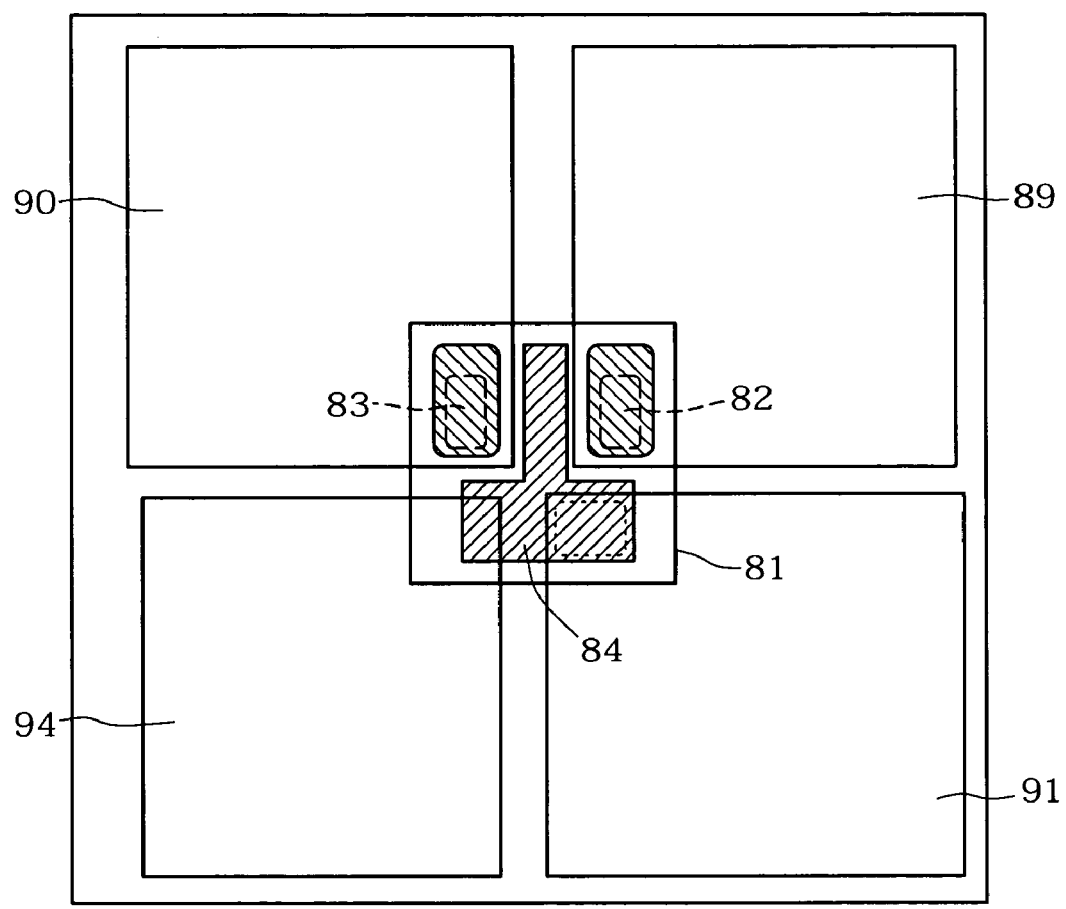
FIG. 11 is a general plan view showing one example in which the present invention is applied to a field effect type transistor.

FIGS. 10 and 11 show an example in which the present invention is applied to a field effect type transistor (FET). The field effect type transistor is produced by providing a source electrode 82, a drain electrode 83, a gate electrode 84, and the like on a semiconductor crystal 81 constituting of Si, GaAs, or the like. The semiconductor crystal 81 provided with these components is embedded in a resin layer 85, and a bottom surface 81*a* thereof is exposed from the resin layer 85 to front on the outside. In addition, take-out electrodes 89, 90, and 91 are led out from the source electrode 82, the drain electrode 83, and the gate electrode 84 to a surface (the upper surface in the figure) of the resin layer 85 through vias 86, 87, and 88. A body take-out electrode 92 is connected to the bottom surface 81*a* of the semiconductor crystal 81 and is connected to a take-out electrode 94 led out to a surface (the upper surface in the figure) of the resin layer 85, which is in the same manner as the other take-out electrodes 89, 90, and 91, through a via 93.

For example, in the cases of a switching transistor for pixels in a liquid crystal display system or a driving transistor for a minute light-emitting diode with an operating current in a microampere region, the size of the active region may be not more than about 10 µm square, and the amount of semiconductor wafer used can be suppressed by minimizing the region necessary for actual mounting and take-out of electrodes. Therefore, an image display system substantially using several hundreds of thousands of devices per system can be realized by a hybrid system, and it is possible to achieve an increase in area, which cannot be achieved by a monolithic system. Besides, also in the size region that is possible by the monolithic system utilizing an amorphous semiconductor or a polycrystalline semiconductor, a system with high performance can be obtained by actually mounting single-crystal semiconductor devices by this method.

Meanwhile, in each of the electronic parts described above, it is also possible to provide the resin layer covering the electrode on the back side, to facilitate the release or the like from, for example, a temporary holding substrate or the like, and to convert the device into the so-called chip component part, which is easy to deal with. FIG. 12 shows an example in which, in the gallium nitride based light-emitting diode shown in FIG. 1, a resin layer 101 formed of polyimide or the like is provided covering the cathode take-out electrode 6 formed on the resin layer 4, to convert the device into a chip component part. Such a structure can be easily formed through inversion, transfer, and the like steps, and is a novel structure in which a both-side take-out structure on the resin layer is provided.

Next, description will be made by taking as an example an image display system obtained by application of rearrangement of devices by a two-stage enlarged transfer method. First, basic constitutions of a device arranging method based on the two-stage enlarged transfer method and a method of manufacturing an image display system will be described. The device arranging method based on the two-stage enlarged transfer method and the method of manufacturing the image display system include a two-stage enlarged transfer in which devices formed on a first substrate in a high degree of integration are transferred onto a temporary holding member so that the devices are spaced wider apart than they have been arranged on the first substrate, and then the devices held on the temporary holding member are transferred onto a second substrate while being spaced further wider apart. While the transfer is conducted in two stages in this example, the transfer may be conducted in three or more stages according to the degree of enlargement of the devices.

FIGS. 13A to 13D show schematic diagrams respectively illustrating basic steps of the two-stage enlarged transfer method. First, devices 112 such as, for example, light-emitting devices are formed densely on a first substrate 110 shown in FIG. 13A. With the devices formed densely, the number of the devices produced per substrate can be enlarged, and production cost can be lowered. The first substrate 110 is a substrate on which various devices can be produced such as, for example, a semiconductor wafer, a glass substrate, a quartz glass substrate, a sapphire substrate, and a plastic substrate. The devices 112 may be those formed directly on the first substrate 110, or may be formed on another substrate and arranged on the first substrate 110.

Next, as shown in FIG. 13B, the devices 112 are transferred from the first substrate 110 onto a temporary holding member 111, and are held on the temporary holding member 111. At this time, simultaneously, covering of the surroundings of the devices 112 with a resin is conducted on the basis of each of the devices 112. The covering of the surroundings of the devices with the resin is conducted for facilitating formation of electrode pads, for facilitating the treating of the devices in a transfer step, and the like purposes. The adjacent devices 112 are subjected to selective separation by, for example, transfers between a plurality of temporary holding members, whereby finally the devices 112 are spaced apart on the temporary holding member, and are arranged in a matrix form as shown in the figure. Namely, while the devices 112 are so transferred that they are spaced wider apart in an x-direction, the devices 112 are so transferred that they are spaced wider apart also in a y-direction perpendicular to the x-direction. The interval to which the devices 112 are spaced wider apart is not particularly limited, and may for example be an interval determined by taking into account the formation of a resin layer or formation of electrode pads in the subsequent steps.

After such a first transfer step, the devices 112 present on the temporary holding member 111 are spaced apart, and formation of electrode pads is conducted on the basis of each of the devices 112, as shown in FIG. 13C. The formation of the electrode pads is conducted with a comparatively large pad size so that failure or defects in wiring would not occur in the final wiring, which is performed after the subsequent second transfer step, as will be described later. The electrode pads are not shown in FIG. 13C. The electrode pads are formed for each of the devices 112 fixed by the resin 113, whereby resin-molded chips 114 are formed. While the device 112 is located at a roughly central position of the resin-molded chip 114 in plan view, the device 112 may be present at a position closer to one side or one corner of the resin-molded chip 114.

Next, as shown in FIG. 13D, the second transfer step is conducted. In this second transfer step, the devices 112 arranged in the matrix form on the temporary holding member 111 are transferred onto a second substrate 115 so that they are spaced further wider apart on the basis of the resin-molded chips 114. Also in the second transfer step, the adjacent devices 112 are spaced apart on the basis of the resin-molded chips 114, and are arranged in a matrix form as shown in the figure. Namely, while the devices 112 are so transferred as to be spaced wider apart in the x-direction, the devices 112 are so transferred as to be spaced wider apart also in the y-direction perpendicular to the x-direction. Where the positions of the devices arranged by the second transfer step correspond to pixels of the final product such as an image display system, roughly an integer times of the initial pitch of the devices 112 will be the pitch of the devices 112 arranged by the second transfer step. Here, the value E of the roughly integer times is expressed by the formula E=n×m, where n is the ratio of enlargement of spaced pitch on the transfer from the first substrate 110 onto the temporary holding member 111, and m is the ratio of enlargement of spaced pitch on the transfer from the temporary holding member 111 onto the second substrate 115.

Wiring is applied to each of the devices 112 spaced apart on the basis of the resin-molded chips 114 on the second substrate 115. At this time, wiring is conducted while restraining as much as possible failure or defects in connection, by utilizing the electrode pads or the like preliminarily provided. For example, where the devices 112 are light-emitting devices such as light-emitting diodes, the wiring includes wirings to p-electrodes and n-electrodes; where the devices 112 are liquid crystal control devices, the wiring includes at least wirings for selection signal lines, voltage lines, orientation electrode films, and the like.

In the two-stage enlarged transfer method illustrated in FIG. 13, formation of the electrode pads and the like can be conducted by utilizing the spaces between the devices after the first transfer, and the wiring is conducted after the second transfer; in this case, the wiring is conducted while restraining as much as possible failure or defects in connection, by utilizing the electrode pads and the like preliminarily provided. Therefore, it is possible to enhance the yield of the image display system. In addition, in the two-stage enlarged transfer method in this example, the steps of spacing the devices wider apart are two steps, and by performing a plurality of steps of enlarged transfer for spacing the devices wider apart, the number of transfers is reduced in practice. Namely, for example, where the ratio of enlargement of spaced pitch on the transfer from the first substrate 110, 110a onto the temporary holding member 111, 111a is 2 (n=2) and the ratio of enlargement of spaced pitch on the transfer from the temporary holding member 111, 111a onto the second substrate 115 is 2 (m=2), if the transfer to the enlarged range is to be performed by a single transfer, the final enlargement ratio is 2×2=4 times, and the square of 4 is 16, so that it is necessary to perform the transfer, namely, alignment of the first substrate, 16 times. On the other hand, according to the two-stage enlarged transfer method in this example, the number of times of alignment required is only 8 times in total, which is a simple sum of the 4 times, which is the square of the enlargement ratio of 2 in the first transfer step and the 4 times, which is the square of the enlargement ratio of 2 in the second transfer step. Namely, since $(n+m)^2 = n^2 + 2nm + m^2$, in the case of intending the same enlargement ratio of transfer, it is always possible to reduce the number of times of transfer by 2 nm times according to the two-stage enlarged transfer method. Therefore, the production process is reduced in time and cost by amounts corresponding to this number of times of alignment, which is particularly profitable where the ratio of enlargement of pitch is great.

While the device 112 is, for example, a light-emitting diode in the two-stage enlarged transfer method shown in FIG. 13, this is not limitative, and the device may be any one selected from other devices, for example, a liquid crystal control device, a photo-electric conversion device, a piezoelectric device, a thin film transistor device, a thin film diode device, a resistance device, a switching device, a minute magnetic device, and a minute optical device, or a part thereof or a combination thereof.

Figure 14:
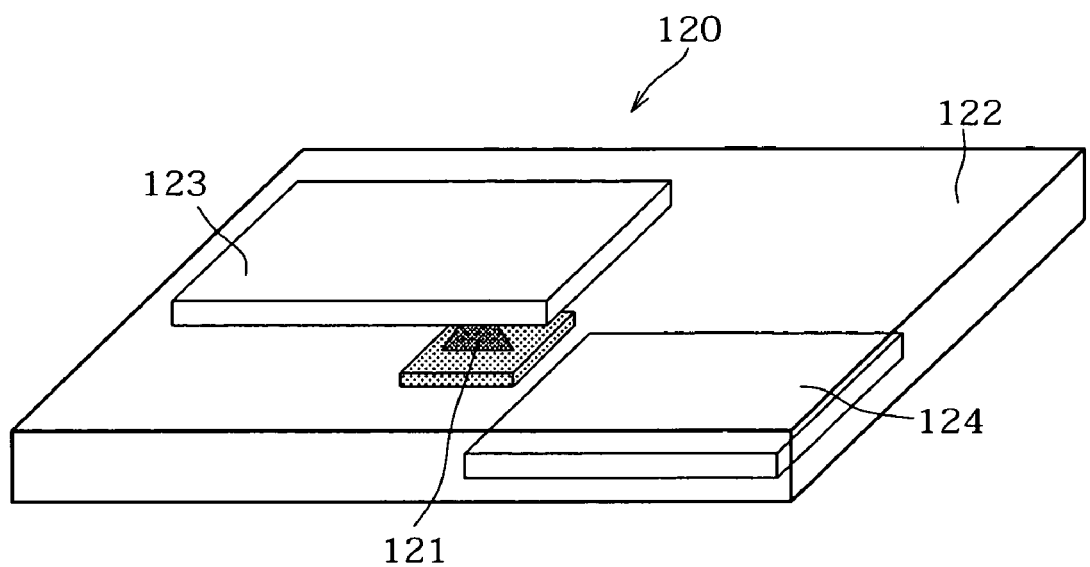
FIG. 14 is a general perspective view of a resin molded chip.
Figure 15:
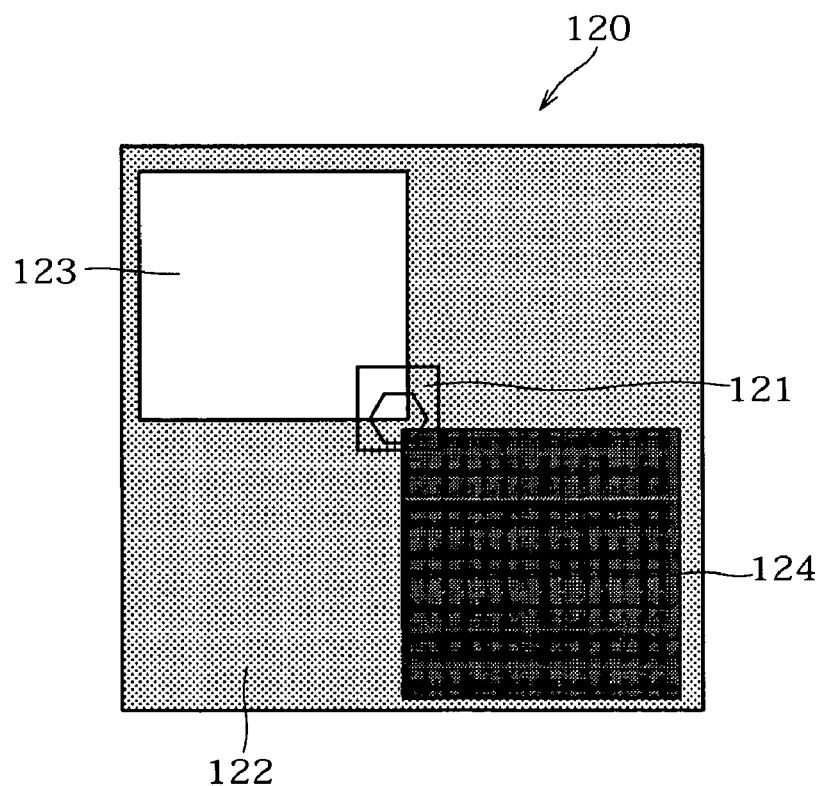
FIG. 15 is a general plan view of the resin molded chip.

In the second transfer step described above, the light-emitting devices are dealt with as resin-molded chips and are respectively transferred from the temporary holding member onto the second substrate. The resin-molded chip will be described referring to FIGS. 14 and 15. The resin-molded chip 120 is obtained by fixing the surroundings of the device 121 arranged in a spaced-apart condition with the resin 122, and the resin-molded chip 120 can be used at the time of transferring the device 121 from the temporary holding member onto the second substrate. The resin-molded chip 120 is roughly flat plate shaped, and major surfaces thereof are each roughly square. The shape of the resin-molded chip 120 is a shape formed by fixing with the resin 122; concretely, the shape is obtained by applying an uncured resin to the whole surface so as to contain each device 121, and after curing of the resin, edge portions are cut by dicing or the like.

Electrode pads 123 and 124 are provided respectively on the face side and the back side of the roughly flat plate shaped resin 122. The electrode pads 123 and 124 are each formed by forming a conductive layer such as a metallic layer and a polycrystalline silicon layer, which constitute the material of the electrode pads 123, 124 on the whole surface, and then patterning the conductive layer into a required electrode shape by photolithography technology. The electrode pads 123 and 124 are so formed as to be connected respectively to the p-electrode and an n-electrode of the device 121, which is the light-emitting device, and if necessary, the resin 122 is provided with via holes or the like.

While the electrode pads 123 and 124 are provided respectively on the face side and the back side of the resin-molded chip 120, they may be provided on the same side of the resin-molded chip 120. In addition, since three electrodes for source, gate, and drain are present in the case of a thin film transistor, for example, three or more electrode pads may be provided. The arrangement in which the positions of the electrode pads 123 and 124 are staggered from each other in plan view is for ensuring that contacts taken from the upper side at the time of final formation of wirings will not overlap with each other. The shape of the electrode pads 123 and 124 is not limited to square, and may be other shape.

By constituting such a resin-molded chip 120, the surroundings of the device 121 can be covered with the resin 122, which is planarized, whereby the electrode pads 123 and 124 can be formed with high accuracy, and the electrode pads 123 and 124 can be extended to wider areas as compared with the device 121, whereby treating of the device 121 is facilitated in the case of conducting transfer in the subsequent second transfer step by use of a suction jig. As will be described later, the final wiring is conducted after the subsequent second transfer step, so that failure or defects in wiring can be prevented by conducting the wiring by utilizing the electrode pads 123 and 124 whose size is comparatively large.

Figure 16A:
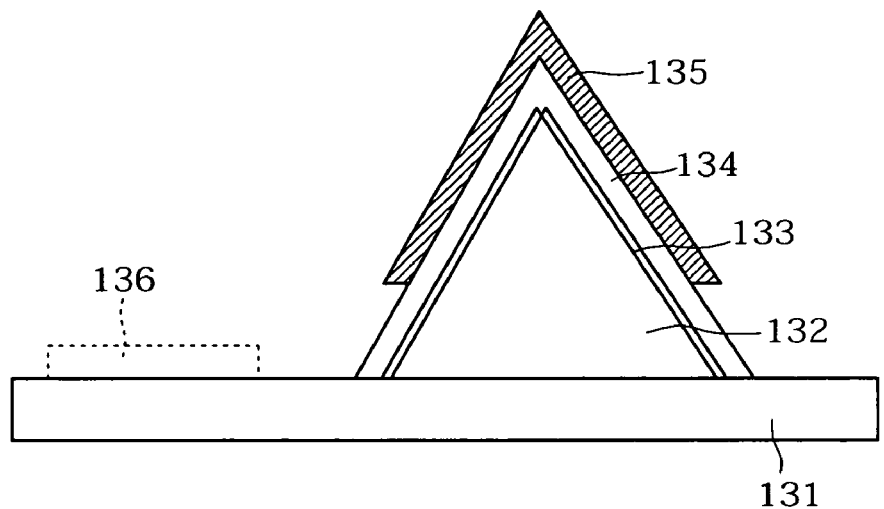
Figure 16B:
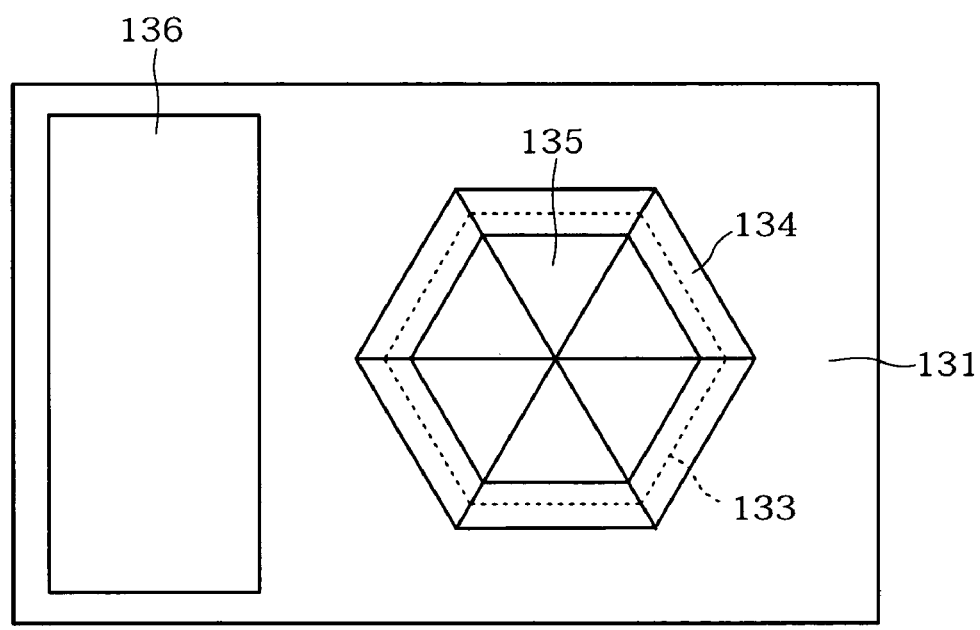

Next, FIGS. 16A and 16B show the structure of a light-emitting device as an example of a device used in the two-stage enlarged transfer method in this example. FIG. 16A is a sectional view of the device, and FIG. 16B is a plan view of the same. The light-emitting device is a GaN based light-emitting diode and is crystally grown on, for example, a sapphire substrate. In such a GaN based light-emitting diode, laser ablation is generated by irradiation with laser transmitted through the substrate, and film exfoliation is generated at the interface between the sapphire substrate and the GaN based grown layer in accordance with on the phenomenon in which nitrogen in GaN is gasified.

First, as to the structure, a hexagonal base pyramid shaped GaN layer 132 selectively grown on a ground growth layer 131 forming of a GaN based semiconductor layer is provided. An insulating film not shown is present on the ground growth layer 131, and the hexagonal base pyramid shaped GaN layer 132 is formed on an opened portion of the insulating film by an MOCVD method or the like. The GaN layer 132 is a pyramid shaped grown layer covered with S planes (1-101 planes) where the primary surface of the sapphire substrate used for growth is a C plane and is a region doped with silicon. The portions of the inclined S planes of the GaN layer 132 function as clads with a double-hetero structure. An InGaN layer 133, which is an active layer is provided so as to cover the inclined S planes of the GaN layer 132, and a magnesium-doped GaN layer 134 is provided on the outside thereof. The magnesium-doped GaN layer 134 also functions as a clad.

Such a light-emitting diode is provided with a p-electrode 135 and an n-electrode 136. The p-electrode 135 is formed by vapor deposition of a metallic material such as Ni/Pt/Au or Ni(Pd)/Pt/Au on the magnesium-doped GaN layer 134. The n-electrode 136 is formed by vapor deposition of a metallic material such as Ti/Al/Pt/Au on the opened portion of the insulating film (not shown) described above. In the case where the n-electrode is taken out from the back side of the ground growth layer 131, formation of the n-electrode 136 is not needed on the face side of the ground growth layer 131.

The GaN based light-emitting diode having such a structure is a device capable also of emitting blue light, and particularly, can be released from the sapphire substrate comparatively easily by laser ablation; selective release can be realized by selective irradiation with laser beam. The GaN based light-emitting diode may have a structure in which the active layer is provided in a flat plate shape or a belt shape, and may have a pyramidal structure in which a C plane is provided at a top end portion. In addition, other nitride based light-emitting diodes and compound semiconductor devices may also be adopted.

Figure 17:
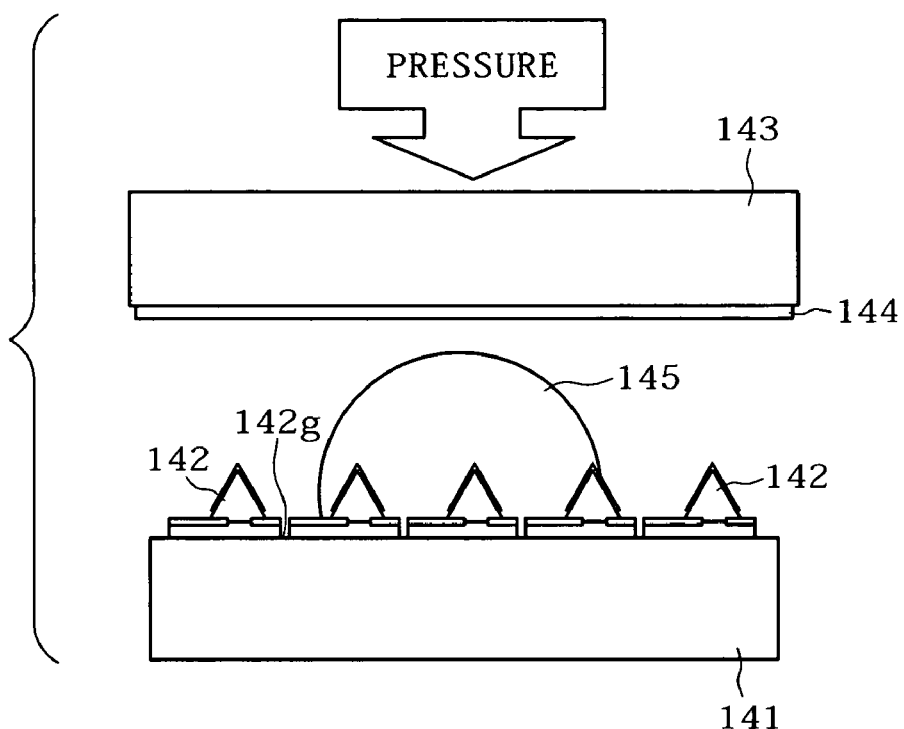
FIG. 17 is a general sectional view showing a step of bonding a first temporary holding member.

Next, a concrete technique of manufacturing an image display system by applying the light-emitting device arranging method shown in FIG. 13 will be described. The light-emitting device uses a GaN based light-emitting diode shown in FIG. 16. First, as shown in FIG. 17, a plurality of light-emitting diodes 142 are provided in a dense condition on a primary surface of a first substrate 141. The size of the light-emitting diodes 142 can be minute, for example, about 20 μm square. As a material for constituting the first substrate 141, a material having a high transmittance for the wavelength of the laser, which the light-emitting diodes 142 are irradiated such as a sapphire substrate, is used. The light-emitting diodes 142 are each provided with up to the p-electrode, but the final wiring is not yet conducted; grooves 142g for separation between the devices are provided, and the individual light-emitting diodes 142 can be separated. Formation of the grooves 142g is conducted by reactive ion etching, for example.

Next, the light-emitting diodes 142 on the first substrate 141 are transferred onto a first temporary holding member 143. Here, as an example of the first temporary holding member 143, there can be used a glass substrate, a quartz glass substrate, a plastic substrate, and the like; in this example, a quartz glass substrate is used. In addition, a release layer 144 functioning as a mold release layer is provided on the surface of the first temporary holding member 143. For the release layer 144, there can be used a fluoro coat, a silicone resin, a water-soluble adhesive (for example, polyvinyl alcohol [PVA]), polyimide, and the like; here, polyimide is used.

Figure 18:
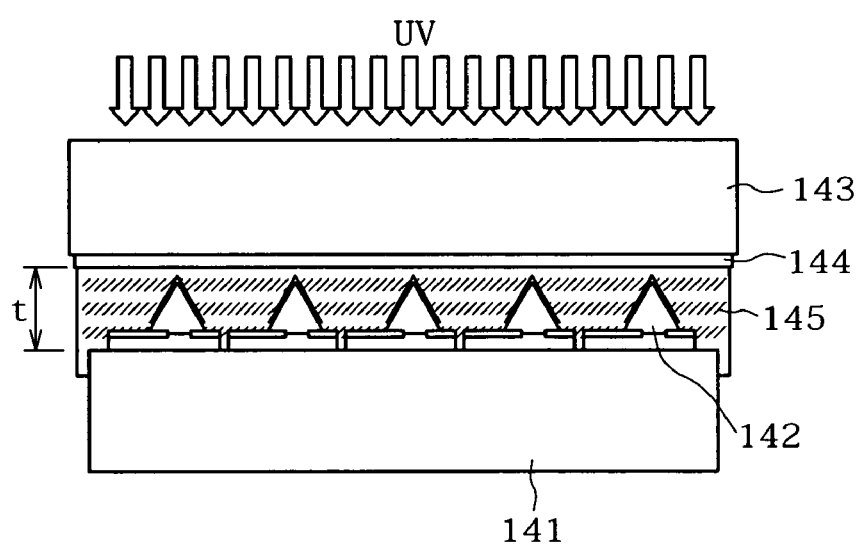
FIG. 18 is a general sectional view showing a step of curing a UV-curable adhesive.

At the time of transfer, as shown in FIG. 17, an adhesive (for example, a UV-curable type adhesive) 145 is applied onto the first substrate 141 in such an amount as to cover the light-emitting diodes 142, and the first temporary holding member 143 is laid thereon so as to be supported by the light-emitting diodes 142. In this condition, the adhesive 145 is irradiated with ultraviolet rays (UV) from the back side of the first temporary holding member 143 as shown in FIG. 18, thereby curing the adhesive 145. The first temporary holding member 143 is a quartz glass substrate, so that the ultraviolet rays are transmitted therethrough, to rapidly cure the adhesive 145.

At this time, the first temporary holding member 143 is supported by the light-emitting diodes 142, so that the spacing between the first substrate 141 and the first temporary holding member 143 is determined by the height of the light-emitting diodes 142. When the adhesive 145 is cured under the condition where the first temporary holding member 143 is so laminated as to be supported by the light-emitting diodes 142 as shown in FIG. 18, the thickness t of the adhesive 145 is restricted by the spacing between the first substrate 141 and the first temporary holding member 143. Therefore, the thickness of t of the adhesive 145 is restricted by the height of the light-emitting diodes 142. Namely, the light-emitting diodes 142 on the first substrate 141 play the role of spacer, whereby the adhesive layer with a fixed thickness is formed between the first substrate 141 and the first temporary holding member 143. Thus, in the above-described method, the thickness of the adhesive layer is determined by the height of the light-emitting diodes 142, so that an adhesive layer with a fixed thickness can be formed without severe control of pressure.

Figure 19:
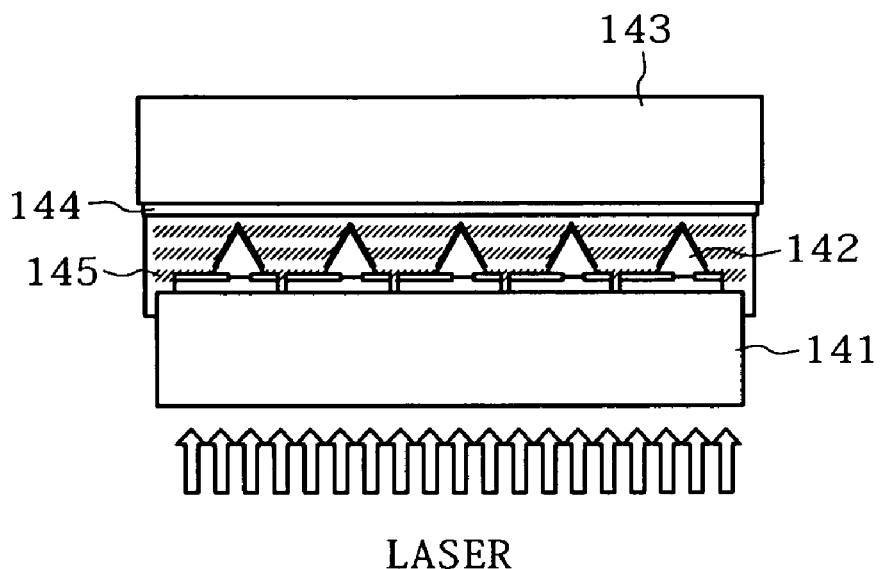
FIG. 19 is a general sectional view showing a laser ablation step.

After the curing of the adhesive 145, as shown in FIG. 19, the light-emitting diodes 142 are irradiated with laser from the back side of the first substrate 141, and the light-emitting diodes 142 are released from the first substrate 141 by utilizing laser ablation. Since the GaN based light-emitting diode 142 is decomposed into metallic Ga and nitrogen at the interface between itself and sapphire, the light-emitting diodes 142 can be released comparatively easily. As the laser for irradiation, excimer laser, higher harmonic YAG laser may be used. By the release utilizing the laser ablation, the light-emitting diodes 142 are separated at the interface between themselves and the first substrate 141, and are transferred onto the temporary holding member 143 in the state of being embedded in the adhesive 145.

Figure 20:
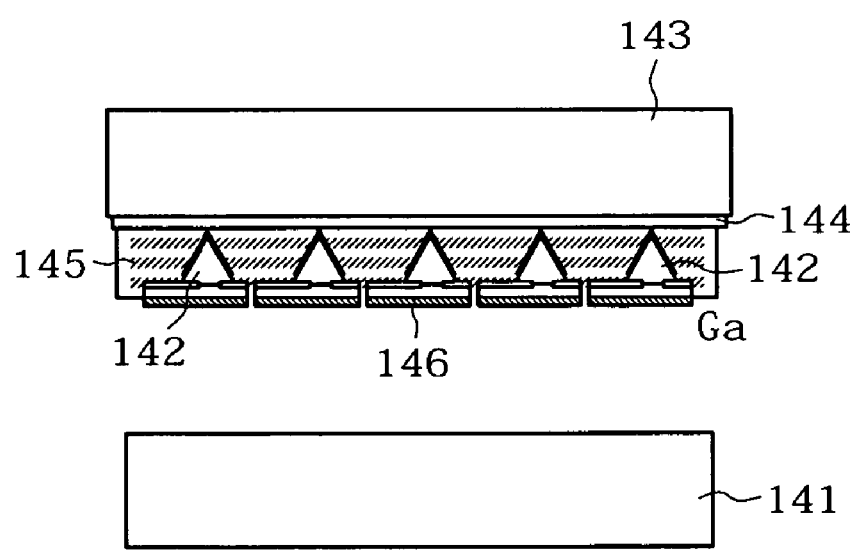
FIG. 20 is a general sectional view showing a step of separating a first substrate.
Figure 21:
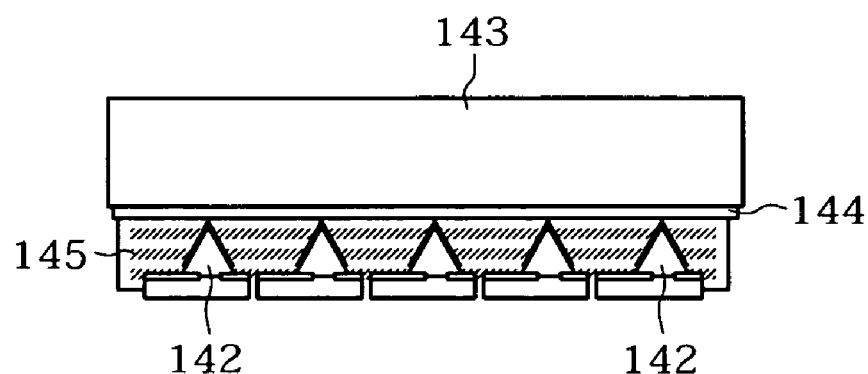
FIG. 21 is a general sectional view showing a Ga removing step.
Figure 22:
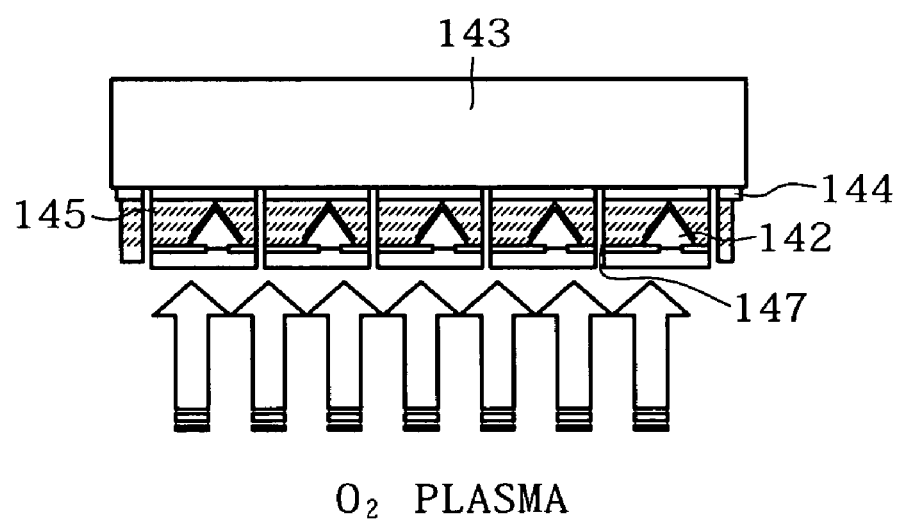
FIG. 22 is a general sectional view showing a step of forming a device separation groove.

FIG. 20 shows the condition where the first substrate 141 has been removed by the above-mentioned release. At this time, the GaN based light-emitting diodes have been released from the first substrate 141 composing of the sapphire substrate by the laser, and Ga 146 has been deposited at the release surface, so that the deposited Ga must be etched. In view of this, wet etching is conducted by use of an aqueous NaOH solution or diluted nitric acid, whereby Ga 146 is removed, as shown in FIG. 21. Further, cleaning of the surface is conducted by use of oxygen plasma ($O_2$ plasma), then, as shown in FIG. 22, the adhesive 145 is cut along the dicing grooves 147 by dicing, and dicing on the basis of each light-emitting diode 142 is conducted, followed by selective separation of the light-emitting diodes 142. The dicing process may be conducted by conventional blade dicing; where narrow cuts with a width of not more than 20 μm is necessary, laser processing by use of the above-mentioned laser is conducted. The width of the cuts depends on the size of the light-emitting diode 142 covered with the adhesive 145 in the pixel of the image display system; as one example, grooves are processed by excimer laser, whereby the shape of the chip is formed.

Figure 23:
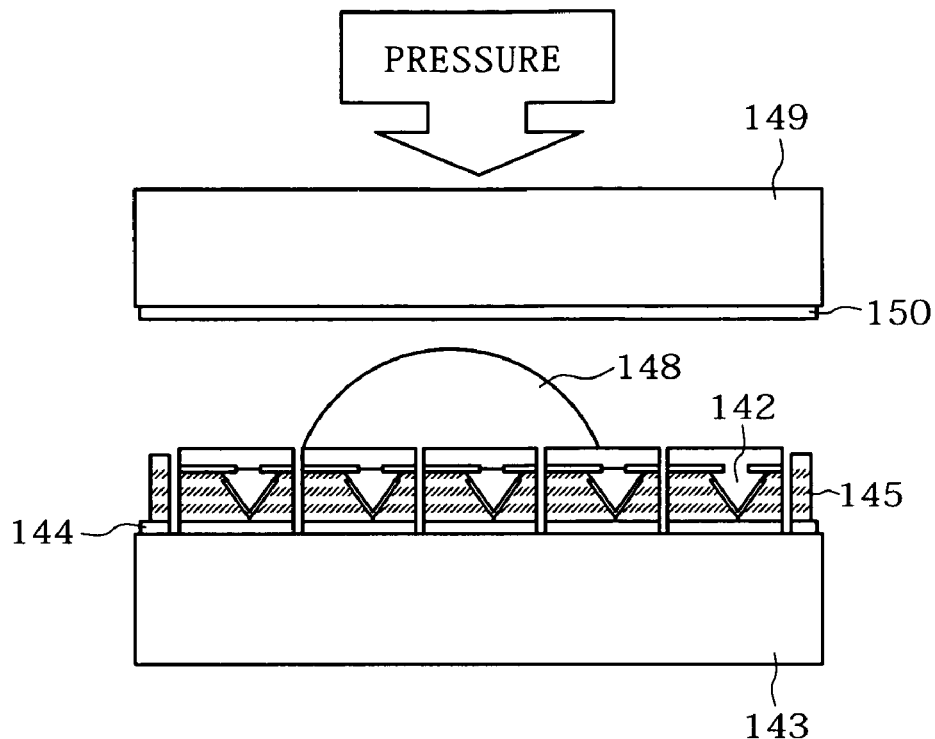
FIG. 23 is a general sectional view showing a step of bonding a second temporary holding member.

For selectively separating the light-emitting diodes 142, first, as shown in FIG. 23, a UV adhesive 148 is applied onto the cleaned light-emitting diodes 142, and a second temporary holding member 149 is laid thereon. As the second temporary holding member 149, there can be used a glass substrate, a quartz glass substrate, a plastic substrate in the same manner as in the case of the first temporary holding member 143; in this example, a quartz glass substrate is used. A release layer 150 formed of polyimide or the like is preliminarily provided also on the face side of the second temporary holding member 149.

Figure 24:
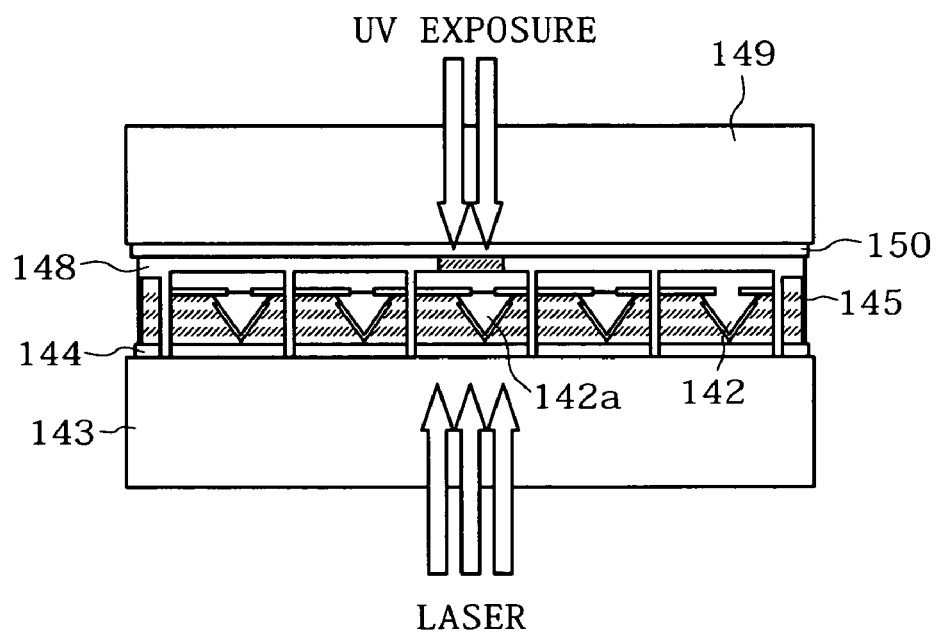
FIG. 24 is a general sectional view showing a selective laser ablation and UV exposure step.
Figure 25:
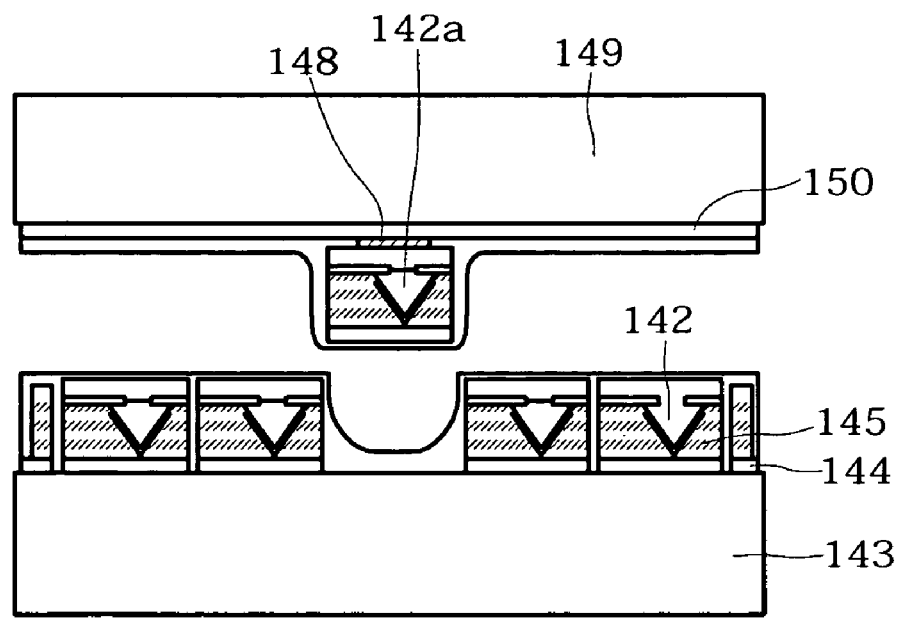
FIG. 25 is a general sectional view showing a step of selectively separating light-emitting diodes.

Next, as shown in FIG. 24, laser is radiated from the back side of the first temporary holding member 143 at only the positions corresponding to the light-emitting diodes 142a being the objects of transfer, and the light-emitting diodes 142a are released from the first temporary holding member 143 by laser ablation. Simultaneously, UV exposure is conducted by radiating ultraviolet rays (UV) from the back side of the second temporary holding member 149 at the positions corresponding to the light-emitting diodes 142a being the objects of transfer, and the UV-curable adhesive 148 at these locations is cured. Thereafter, the second temporary holding member 149 is released from the first temporary holding member 143, upon which only the light-emitting diodes 142a being the objects of transfer are selectively separated, and are transferred onto the second temporary holding member 149, as shown in FIG. 25.

Figure 26:
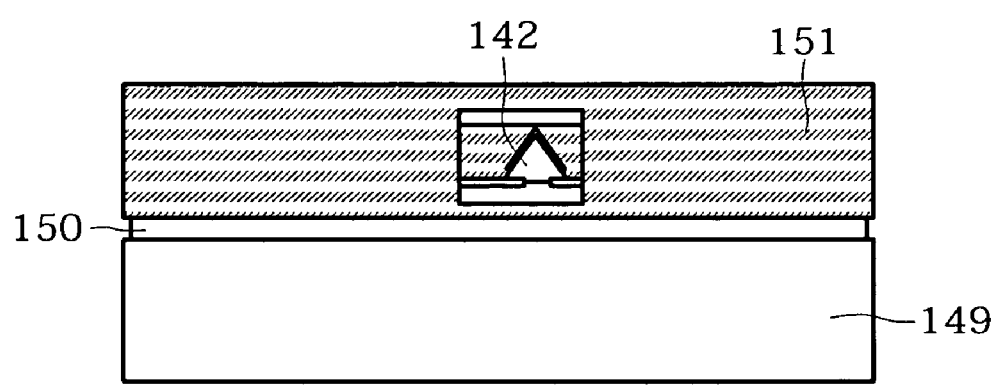
FIG. 26 is a general sectional view showing a step of embedding by use of a resin.
Figure 27:
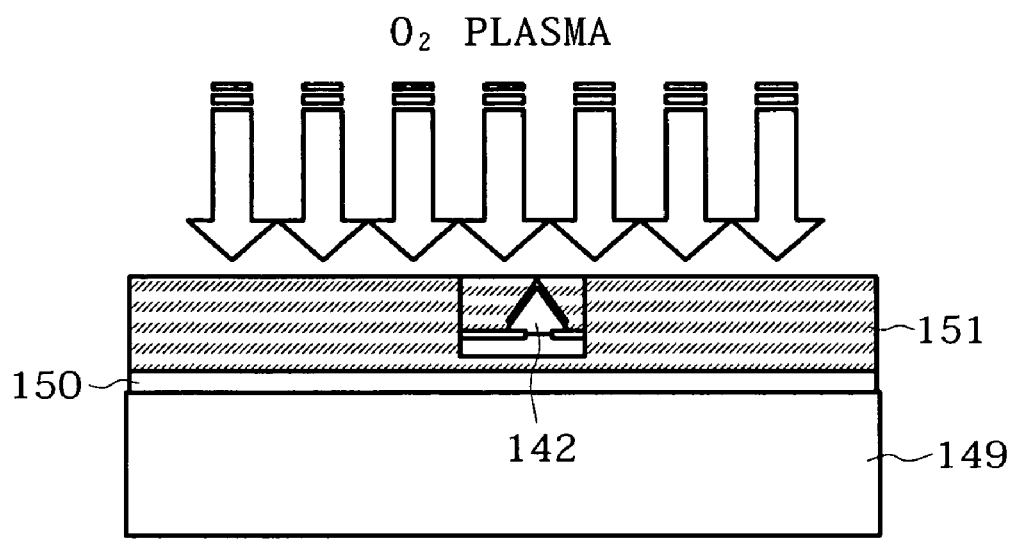
FIG. 27 is a general sectional view showing a step of reducing the thickness of a resin layer.
Figure 28:
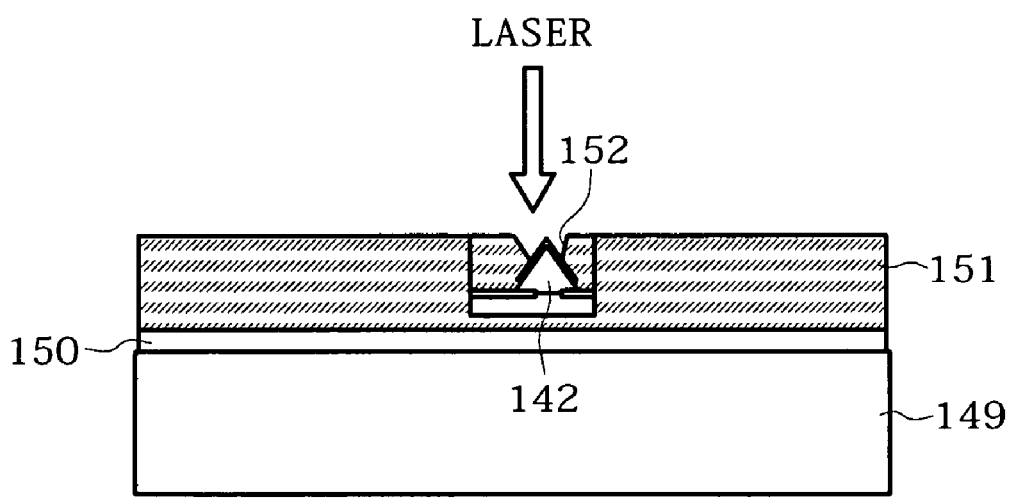
FIG. 28 is a general sectional view showing a via forming step.

After the selective separation, as shown in FIG. 26, a resin is applied so as to cover the transferred light-emitting diodes 142, to form a resin layer 151. Further, as shown in FIG. 27, the thickness of the resin layer 151 is reduced by oxygen plasma or the like, and as shown in FIG. 28, via holes 152 are formed by irradiation with laser at positions corresponding to the light-emitting diodes 142. For formation of the via holes 152, there can be used excimer laser, higher harmonic YAG laser, carbon dioxide gas laser, and the like. At this time, the via holes 152 are formed by opening holes with a diameter of about 3 to 7 μm, for example.

Figure 29:
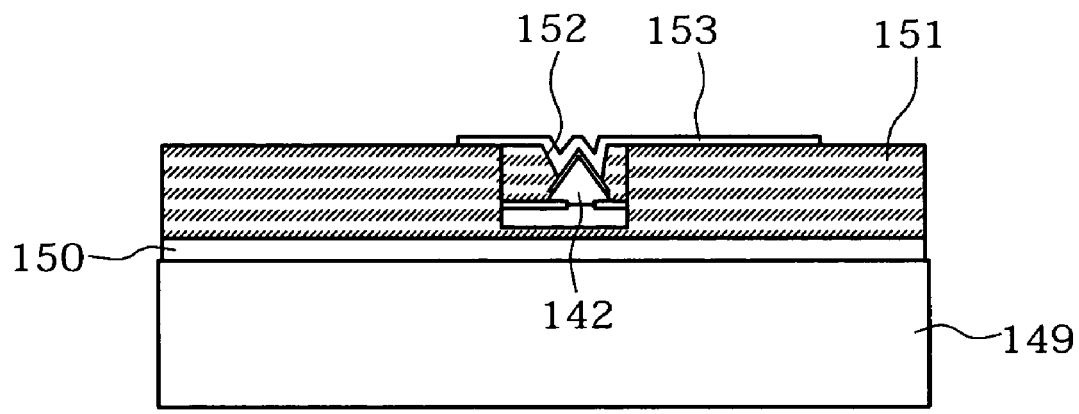
FIG. 29 is a general sectional view showing a step of forming an electrode pad on the anode side.

Next, anode side electrode pads 153 to be connected to the p-electrodes of the light-emitting diodes 142 through the via holes 152 are provided. The anode side electrode pads 153 are formed of, for example, Ni/Pt/Au. FIG. 29 shows the condition where the light-emitting diodes 142 have been transferred onto the second temporary holding member 149, the via holes 152 on the side of the anode electrodes (p-electrodes) have been formed, and then the anode side electrode pads 153 have been formed.

Figure 30:
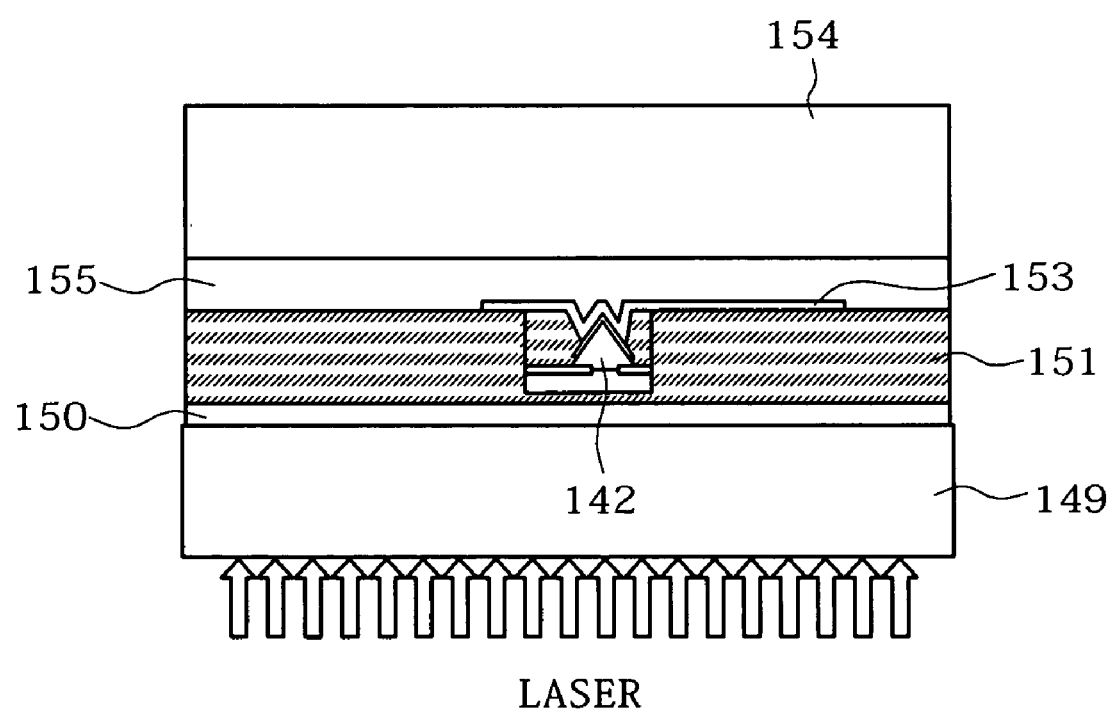
FIG. 30 is a general sectional view showing a laser ablation step.
Figure 31:
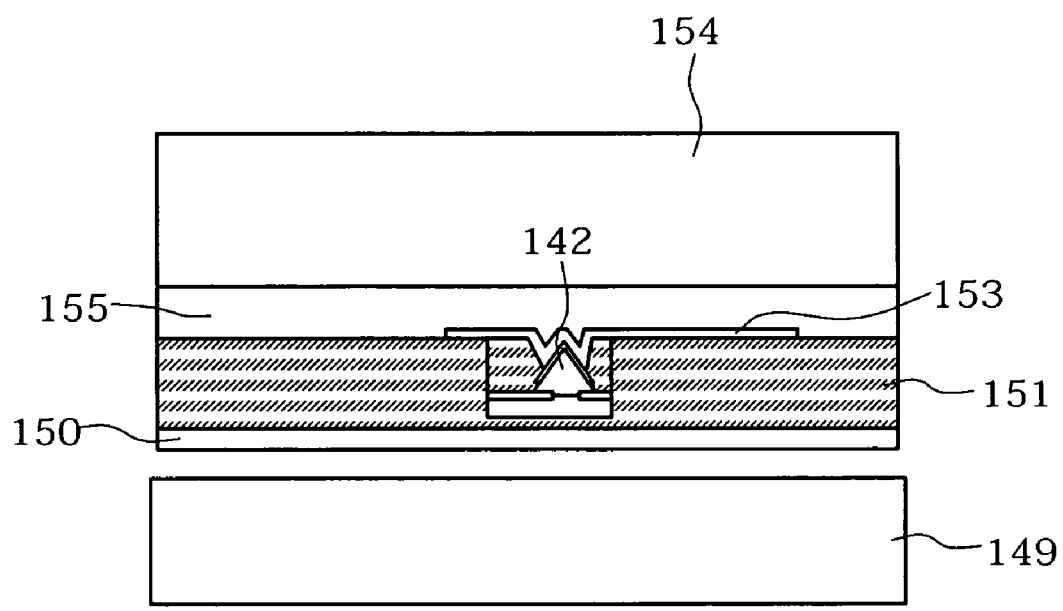
FIG. 31 is a general sectional view showing a step of separating the second temporary holding member.

After the anode side electrode pads 153 are formed, transfer onto a third temporary holding member 154 is conducted, for formation of cathode side electrodes on the opposite side. The third temporary holding member 154 also is formed, for example, of quartz glass. At the time of transfer, as shown in FIG. 30, an adhesive 155 is applied to the light-emitting diodes 142 provided with the anode side electrode pads 153 and to the resin layer 151, and the third temporary holding member 154 is adhered thereonto. In this condition, laser is radiated from the back side of the second temporary holding member 149, upon which release due to laser ablation occurs at the interface between the second temporary holding member 149 formed of quartz glass and the release layer 150 formed of polyimide on the second temporary holding member 149. The light-emitting diodes 142 and the resin layer 151, which are formed on the release layer 150 are transferred onto the third temporary holding member 154. FIG. 31 shows the condition where the second temporary holding member 149 has been separated.

Figure 32:
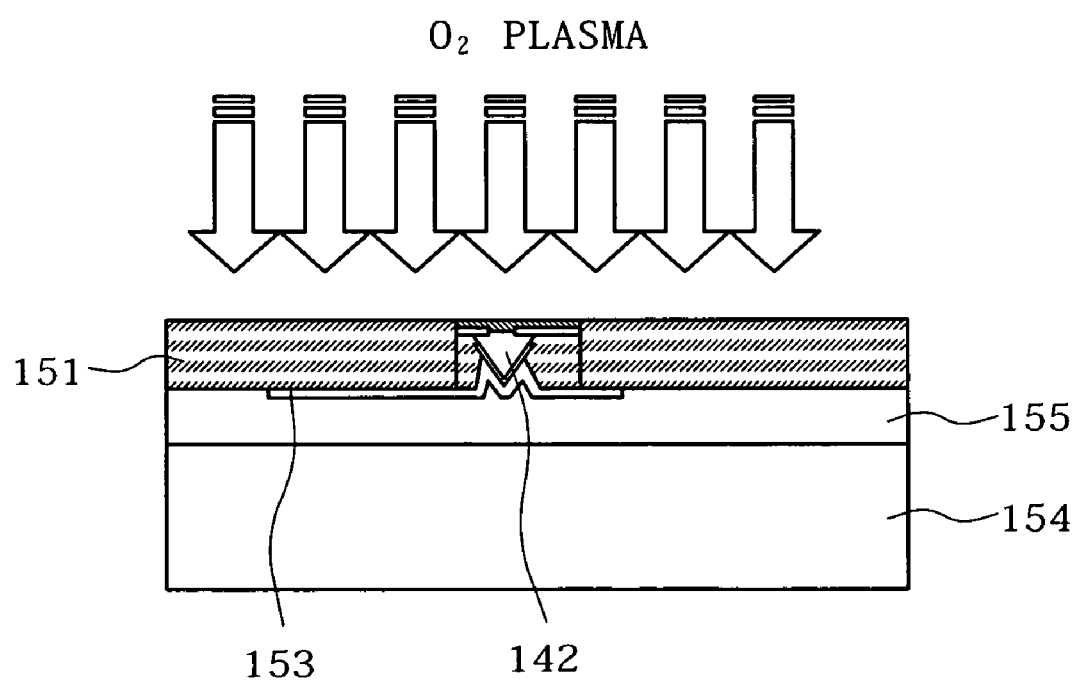
FIG. 32 is a general sectional view showing a step of exposing a contact semiconductor layer.
Figure 33:
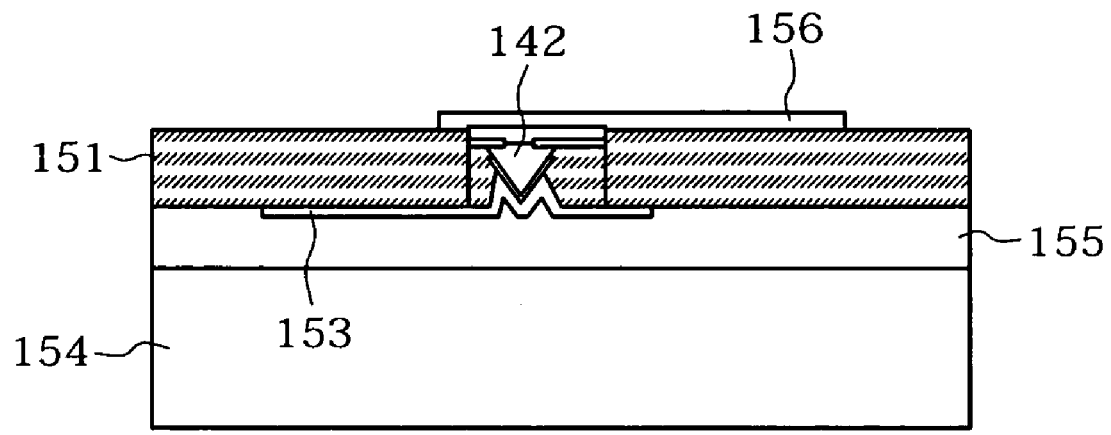
FIG. 33 is a general sectional view showing a step of forming an electrode pad on the side of a cathode.

At the time of forming the cathode side electrodes, after the above-mentioned transfer step, an $O_2$ plasma processing shown in FIG. 32 is conducted to remove the release layer 150 and excess portions of the resin layer 151, thereby exposing a contact semiconductor layer (n-electrodes) of the light-emitting diodes 142. In the condition where the light-emitting diodes 142 are held by the adhesive layer 155 on the temporary holding member 154, the back side of the light-emitting diodes 142 is the n-electrode side (cathode electrode side); when electrode pads 156 are provided as shown in FIG. 33, the electrode pads 156 are electrically connected to the back side of the light-emitting diodes 142. The electrode pad on the cathode side at this time can be, for example, about 60 μm square. As the electrode pads 156, there may be used transparent electrodes (ITO, ZnO based) or a material such as Ti/Al/Pt/Au. In the case of the transparent electrodes, emission of light would not be blocked even if the back side of the light-emitting diodes 142 is largely covered with the transparent electrodes, so that patterning accuracy may be rough, large electrodes can be formed, and the patterning process becomes easy.

Figure 34:
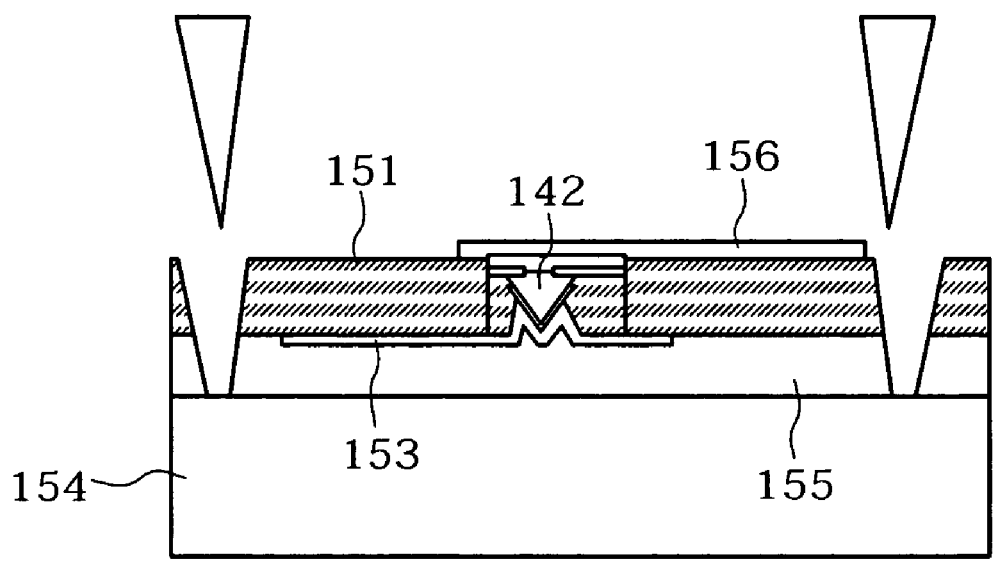
FIG. 34 is a general sectional view showing a laser dicing step.

Next, the light-emitting diodes 142 fixed with the resin layer 151 and the adhesive 155 are individually diced, into the state of the above-mentioned resin-molded chips. The dicing may be performed, for example, by laser dicing. FIG. 34 shows a dicing step by laser dicing. The laser dicing is conducted by irradiation with a laser line beam, whereby the resin layer 151 and the adhesive 155 are cut until the third temporary holding member 154 is exposed. By the laser dicing, the light-emitting diodes 142 are diced as the resin-molded chips having a predetermined size and are transported to an actual mounting step, which will be described later.

Figure 35:
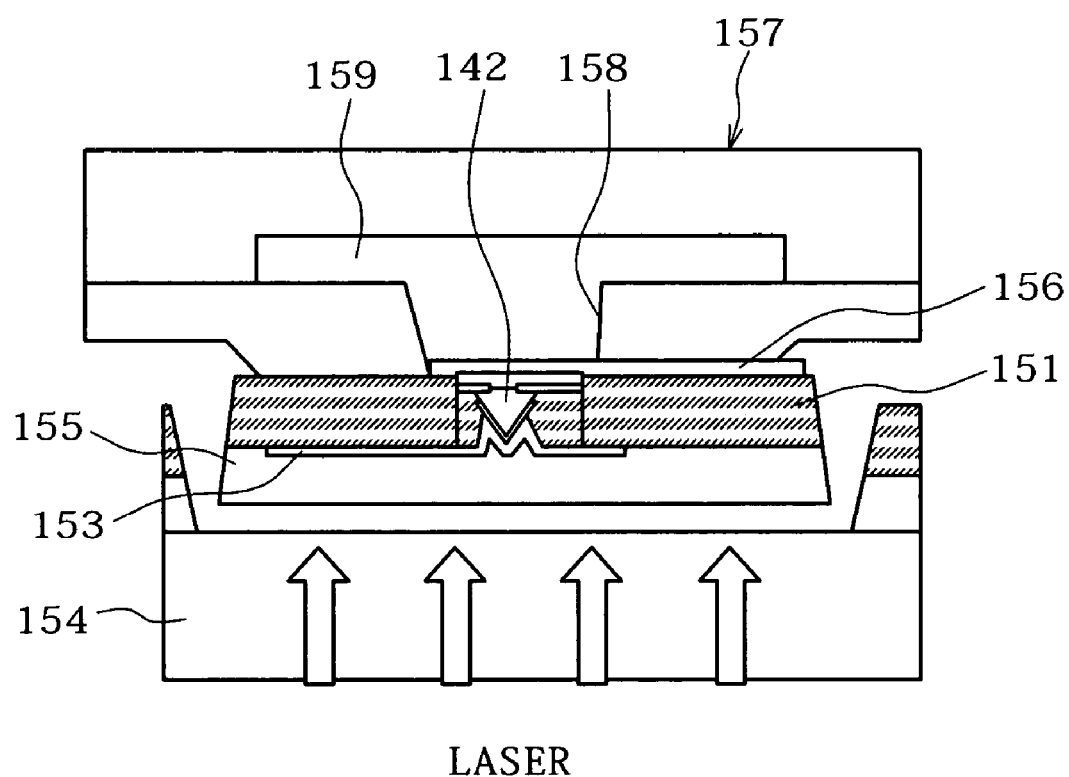
FIG. 35 is a general sectional view showing a step of selective pick-up by a suction device.

In the actual mounting step, the light-emitting diodes 142 (resin-molded chips) are released from the third temporary holding member 154 by a combination of a mechanical means (suction of the devices by vacuum suction) and laser ablation. FIG. 35 illustrates the condition where the light-emitting diodes 142 arranged on the third temporary holding member 154 are picked up by a suction equipment 157. Suction holes 158 at this time are opened in a matrix form with the pixel pitch of the image display system, and a multiplicity of the light-emitting diodes 142 can be picked up by suction at a stroke. For example, the diameter of the openings is about 100 μm, the pitch of the matrix is about 600 μm, and about 300 pieces are picked up by suction at a stroke. At this time, the member of the suction holes 158 is produced by Ni electroplating, or a metallic sheet of stainless steel (SUS), or the like provided with holes by etching. A suction chamber 159 is provided at the depth of the suction holes 158, and the negative pressure in the suction chamber 159 is controlled, whereby the light-emitting diodes 142 can be picked up by suction. At this stage, the light-emitting diodes 142 are covered with the resin layer 151, and the upper surface thereof is roughly planarized. Therefore, selective suction by the suction equipment 157 can be carried out easily.

At the time of releasing the light-emitting diodes 142, pick up by suction of the devices by the suction equipment 157 is combined with the release of the resin-molded chips by laser ablation, whereby the releasing causes to proceed smoothly. The laser ablation is conducted by radiating the laser from the back side of the third temporary holding member 154. By the laser ablation, release is generated at the interface between the third temporary holding member 154 and the adhesive 155.

Figure 36:
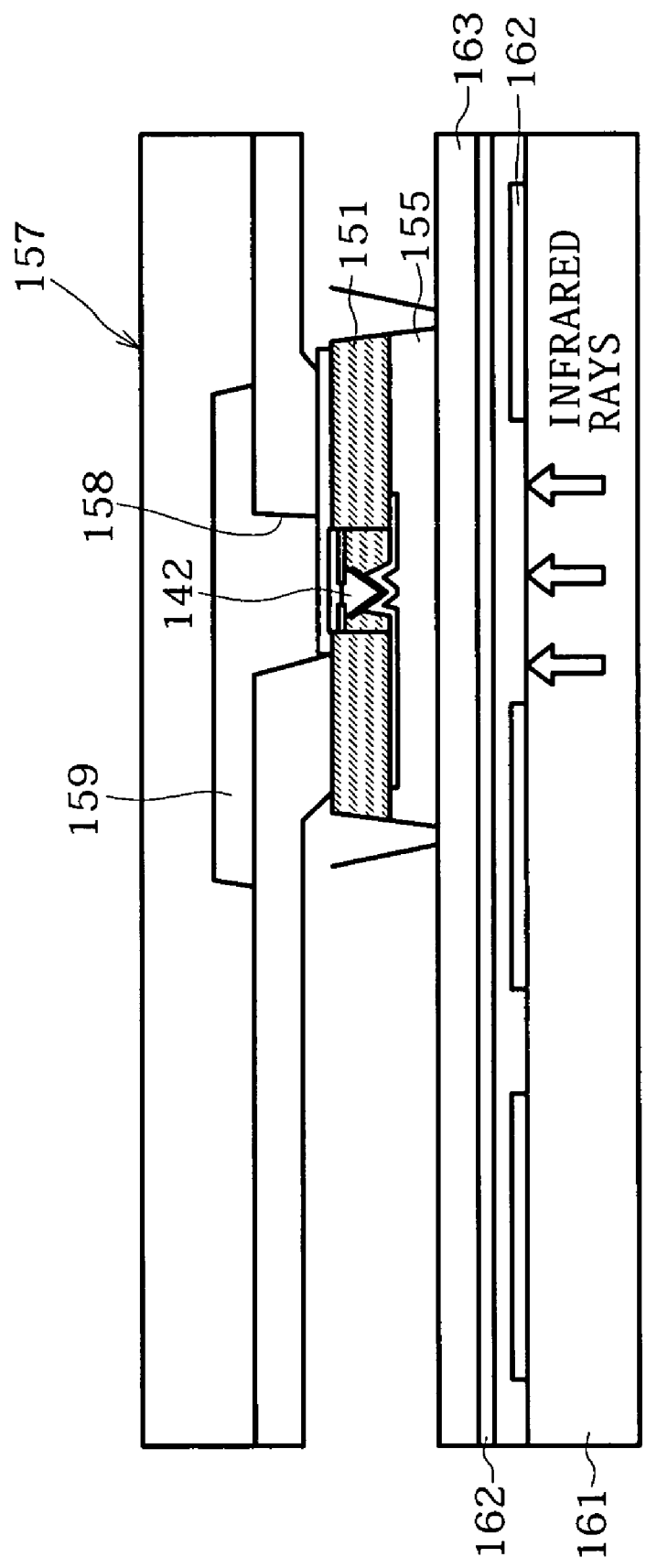
FIG. 36 is a general sectional view showing a step of transfer onto a second substrate.

FIG. 36 illustrates the transfer of the light-emitting diodes 142 onto a second substrate 161. The second substrate 161 is a wiring substrate provided with a wiring layer 162, and at the time of fitting the light-emitting diodes 142 thereto, an adhesive layer 163 is preliminarily applied to the second substrate 161. The adhesive layer 163 beneath the light-emitting diodes 142 is cured, whereby the light-emitting diodes 142 can be arranged in the state of being fixed to the second substrate 161. At the time of the fitting, the suction chamber 159 of the suction equipment 157 is in a high pressure condition, so that the connection between the suction equipment 157 and the light-emitting diodes 142 by suction is released. The adhesive layer 163 can be formed of a UV-curable type adhesive, a thermosetting adhesive, a thermoplastic adhesive, or the like. The positions of arrangement of the light-emitting diodes 142 on the second substrate 161 is spaced wider apart than in the arrangement on the first temporary holding member 154. The energy for curing the resin constituting the adhesive layer 163 is supplied from the back side of the second substrate 161. The adhesive layer 163 only at locations beneath the light-emitting diodes 142 is cured by a UV irradiation equipment in the case of the UV-curable type adhesive, and by infrared ray heating in the case of the thermosetting adhesive. In the case of the thermoplastic adhesive, the adhesive is melted by irradiation with infrared rays or laser, and adhesion is achieved.

Figure 37:
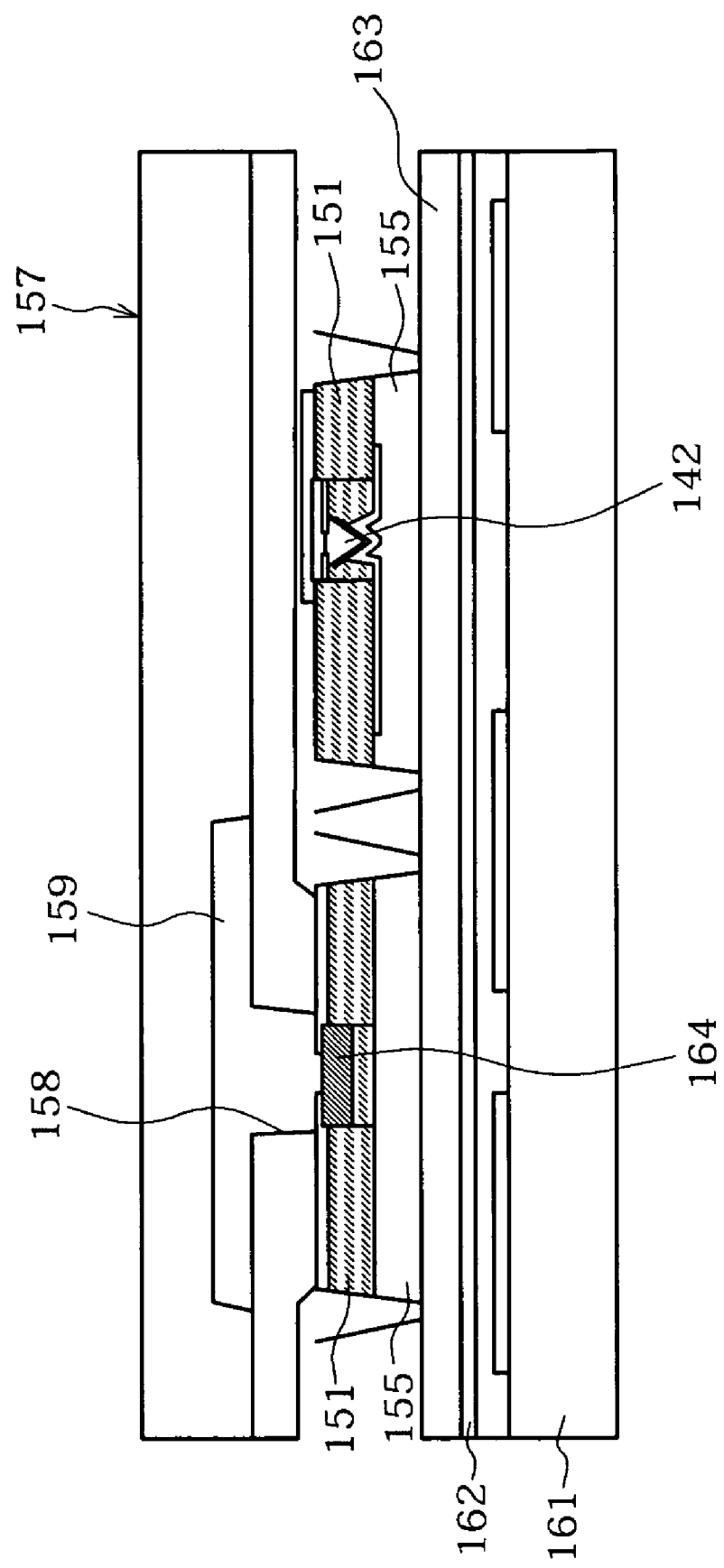
FIG. 37 is a general sectional view showing another step of transfer of light-emitting diodes.

FIG. 37 shows a process of arranging light-emitting diodes 164 for other color on the second substrate 161. When the suction equipment 157 shown in FIG. 35 is used as it is and mounting is conducted by shifting the mounting positions on the second substrate 161 to the other color positions, it is possible to form pixels constituting of a plurality of colors while maintaining the pixel pitch to be constant. Here, the light-emitting diodes 142 and the light-emitting diodes 164 may not necessarily have the same shape. In FIG. 37, the light-emitting diodes 164 for red color have a structure lacking in the hexagonal base pyramid shaped GaN layer and are different from the light-emitting diodes 142 in shape. At this stage, the light-emitting diodes 142 and 164 have already been covered with the resin layer 151 and the adhesive 155 to be the resin-molded chips, so that they can be dealt with in the same manner notwithstanding the difference in device structure.

Figure 38:
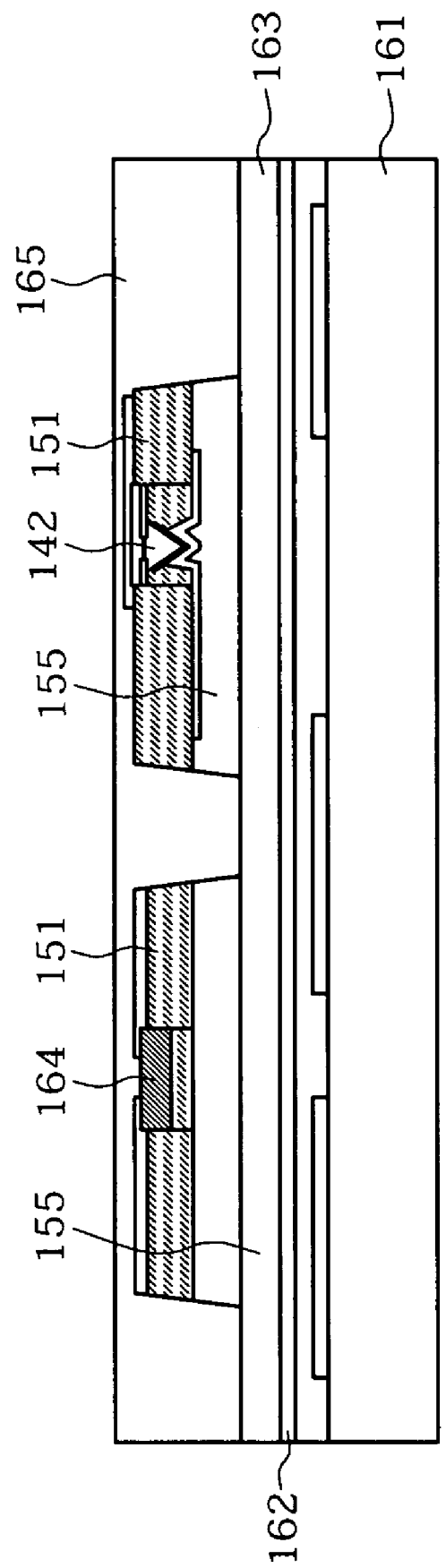
FIG. 38 is a general sectional view showing a step of forming an insulating layer.
Figure 39:
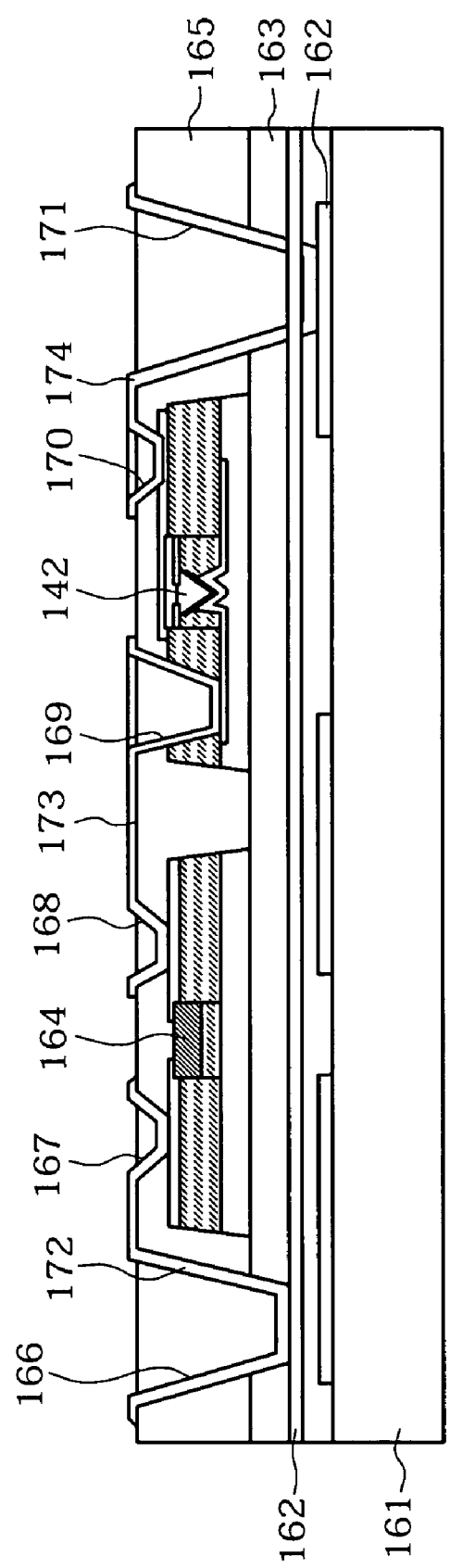
FIG. 39 is a general sectional view showing a wiring forming step.

Next, as shown in FIG. 38, an insulating layer 165 is provided covering the resin-molded chips containing the light-emitting diodes 142, 164. As the insulating layer 165, there can be used a transparent epoxy adhesive, a UV-curable type adhesive, polyimide, and the like. After the formation of the insulating layer 165, a wiring forming step is conducted. FIG. 39 illustrates the wiring forming step. The figure shows the condition where the insulating layer 165 is provided with opening portions 166, 167, 168, 169, 170, and 171, and wirings 172, 173, and 174 for connection between the electrode pads for anodes and cathodes of the light-emitting diodes 142, 164 and a wiring layer 162 on the second substrate 161. The opening portions, namely, via holes formed at this time can be large because the areas of the electrode pads for the light-emitting diodes 142, 164 are large, and the positional accuracy of the via holes can be rougher as compared with the via holes that are formed directly in the light-emitting diodes. For example, via holes with a diameter of about 20 µm can be formed, for the electrode pads having a size of about 60 µm square. As for the depth of the via holes, there are three kinds of depth, for connection with the wiring substrate, for connection with the anode electrode, and for connection with the cathode electrode. Therefore, optimum depths are opened by controlling the pulse number of laser.

Figure 40:
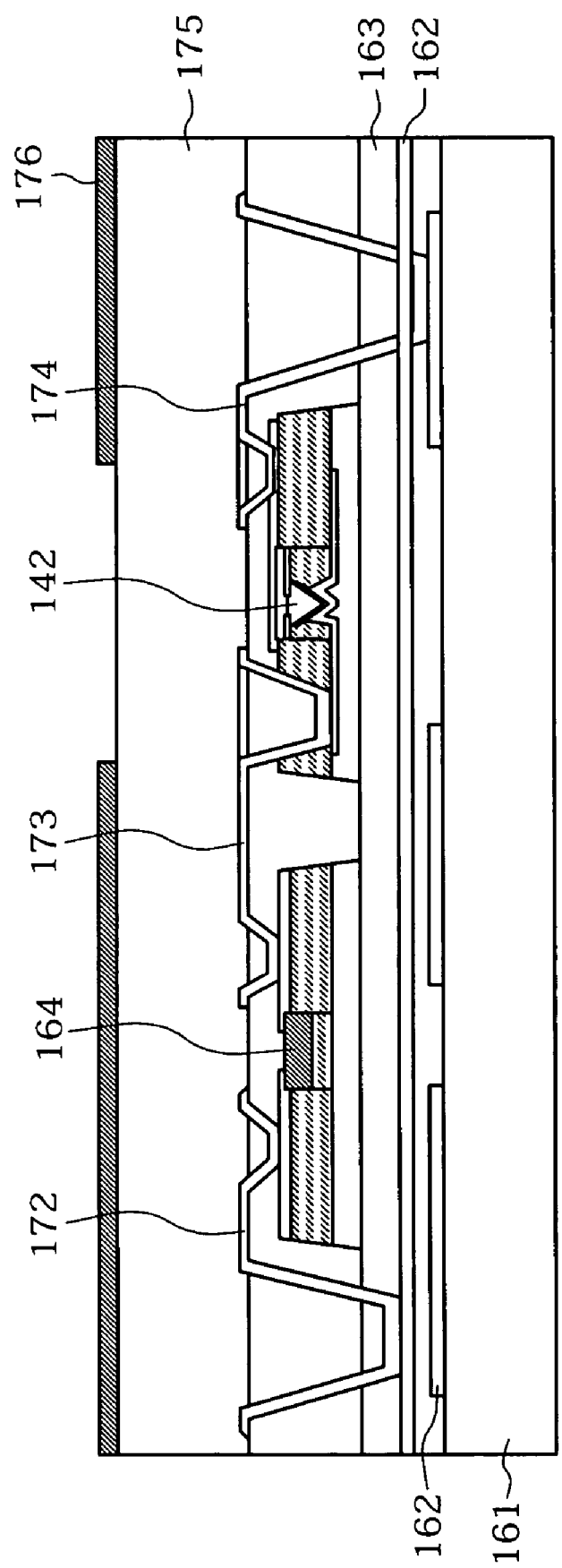
FIG. 40 is a general sectional view showing a step of forming a protective layer and a black mask.

Thereafter, as shown in FIG. 40, a protective layer 175 is provided, and a black mask 176 is formed, to complete the panel of the image display system. The protective layer 175 at this time is the same as the insulating layer 165 shown in FIG. 37. Materials such as a transparent epoxy resin can be used. The protective layer 175 is heated and cured, to wholly cover the wirings. Thereafter, a driver IC is connected with the wiring at an end portion of the panel, whereby a driving panel is manufactured.

In the light-emitting device arranging method as described above, at the time when the light-emitting diodes 142 are held on the temporary holding member 149, 154, the interval between the devices is already enlarged, and the electrode pads 153, 156 with a comparatively large size can be provided by utilizing the enlarged spacing. Since the wiring is conducted by utilizing the electrode pads 153, 156 having the comparatively large size, wiring can be easily carried out even in the case where the final system size is conspicuously large as compared with the device size. In addition, in the light-emitting device arranging method in this example, the surroundings of the light-emitting diodes 142 are covered with the resin layer 151, and the planarization makes it possible to form the electrode pads 153, 156 with high accuracy. Besides, the electrode pads 153, 156 can be extended over a wider region as compared with the device, and, in the case of performing the transfer in the subsequent second transfer step by a suction jig, easy treating of the devices is promised.

While a preferred embodiment of the invention has been described using specific terms, such description is for illustrative purposes only, and it is to be understood that changes and variations may be made without departing from the spirit or scope of the following claims.

What is claimed is:

1. A method of producing an electronic part, comprising steps of epitaxially growing a semiconductor crystal layer on a seed crystal substrate, embedding said semiconductor crystal layer into an insulating material and removing said seed crystal substrate, forming an electrode connected to a surface on one side of said semiconductor crystal layer, transferring said semiconductor crystal layer embedded in said insulating material onto a support substrate, forming an electrode connected to a surface on an opposite side of said semiconductor crystal layer, and forming lead-out electrodes connected to said electrodes by vias that penetrate through the insulating material, wherein the semiconductor crystal layer comprises GaN.

* * * * *